US012635431B2

(12) United States Patent
Zhang et al.

(10) Patent No.: US 12,635,431 B2
(45) Date of Patent: May 19, 2026

(54) HIGH ASPECT RATIO CARBON LAYER ETCH WITH IMPROVED THROUGHPUT AND PROCESS WINDOW

(71) Applicant: Tokyo Electron Limited, Tokyo (JP)

(72) Inventors: Du Zhang, Albany, NY (US);
Shihsheng Chang, Albany, NY (US);
Toru Hisamatsu, Albany, NY (US);
Koki Mukaiyama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 390 days.

(21) Appl. No.: 18/412,687

(22) Filed: Jan. 15, 2024

(65) Prior Publication Data

US 2025/0232981 A1      Jul. 17, 2025

(51) Int. Cl.
| | |
|---|---|
| *H10P 50/24* | (2026.01) |
| *H10P 50/20* | (2026.01) |
| *H10P 50/28* | (2026.01) |
| *H10P 76/40* | (2026.01) |
| *H10P 95/00* | (2026.01) |
| *H10W 20/00* | (2026.01) |

(52) U.S. Cl.
CPC ............ *H10P 50/244* (2026.01); *H10P 50/20* (2026.01); *H10P 50/242* (2026.01); *H10P 50/28* (2026.01); *H10P 76/405* (2026.01); *H10P 95/066* (2026.01); *H10W 20/076* (2026.01)

(58) Field of Classification Search
None
See application file for complete search history.

(56) References Cited

U.S. PATENT DOCUMENTS

| | | | |
|---|---|---|---|
| 6,387,287 | B1 | 5/2002 | Hung et al. |
| 11,195,723 | B1 | 12/2021 | Chang et al. |
| 11,538,692 | B2 | 12/2022 | Kim et al. |
| 2009/0011592 | A1 | 1/2009 | Uno et al. |
| 2016/0260620 | A1 | 9/2016 | Briggs et al. |
| 2021/0391181 | A1* | 12/2021 | Chang ................... H10P 50/283 |
| 2022/0375759 | A1* | 11/2022 | Kim ................. H01J 37/32834 |
| 2023/0245895 | A1 | 8/2023 | Yao et al. |

FOREIGN PATENT DOCUMENTS

| | | |
|---|---|---|
| WO | 2023034518 | 3/2023 |
| WO | 2023127820 | 7/2023 |

OTHER PUBLICATIONS

Notification Of Transmittal Of The International Search Report And The Written Opinion, International Application No. PCT/US2024/052574, Feb. 9, 2025, 11 pgs.

* cited by examiner

*Primary Examiner* — Jiong-Ping Lu

(74) *Attorney, Agent, or Firm* — Egan, Enders & Huston LLP.

(57) ABSTRACT

Various embodiments of improved process flows and methods are provided herein for etching high aspect ratio (HAR) features in carbon-containing hard mask layers. In the disclosed embodiments, the improved process flows and methods combine sidewall passivation and mask de-clogging steps in a single plasma process step to improve throughput when etching HAR features (such as vias, contact holes, trenches, etc.) within a carbon-containing hard mask layer. In doing so, the improved process flows and methods disclosed herein protect the sidewall surfaces of the carbon-containing hard mask layer and prevent bowing during the HAR etch process, while also reducing processing time and improving throughput.

20 Claims, 9 Drawing Sheets

350
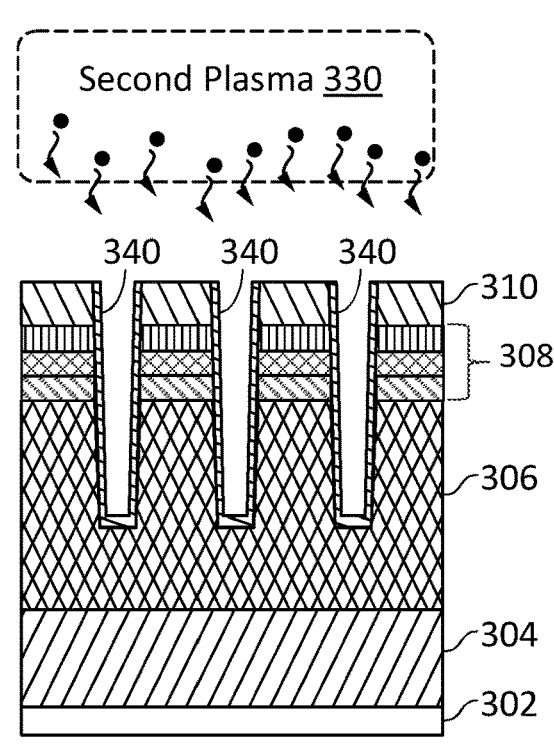
Second Plasma 330
340    340    340
310
308
306
304
302
*FIG. 3C*
350
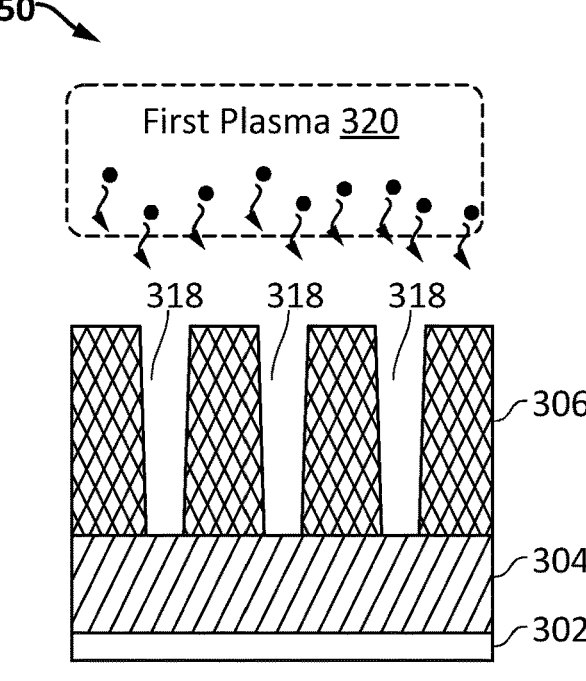
First Plasma 320
318    318    318
306
304
302
*FIG. 3D*

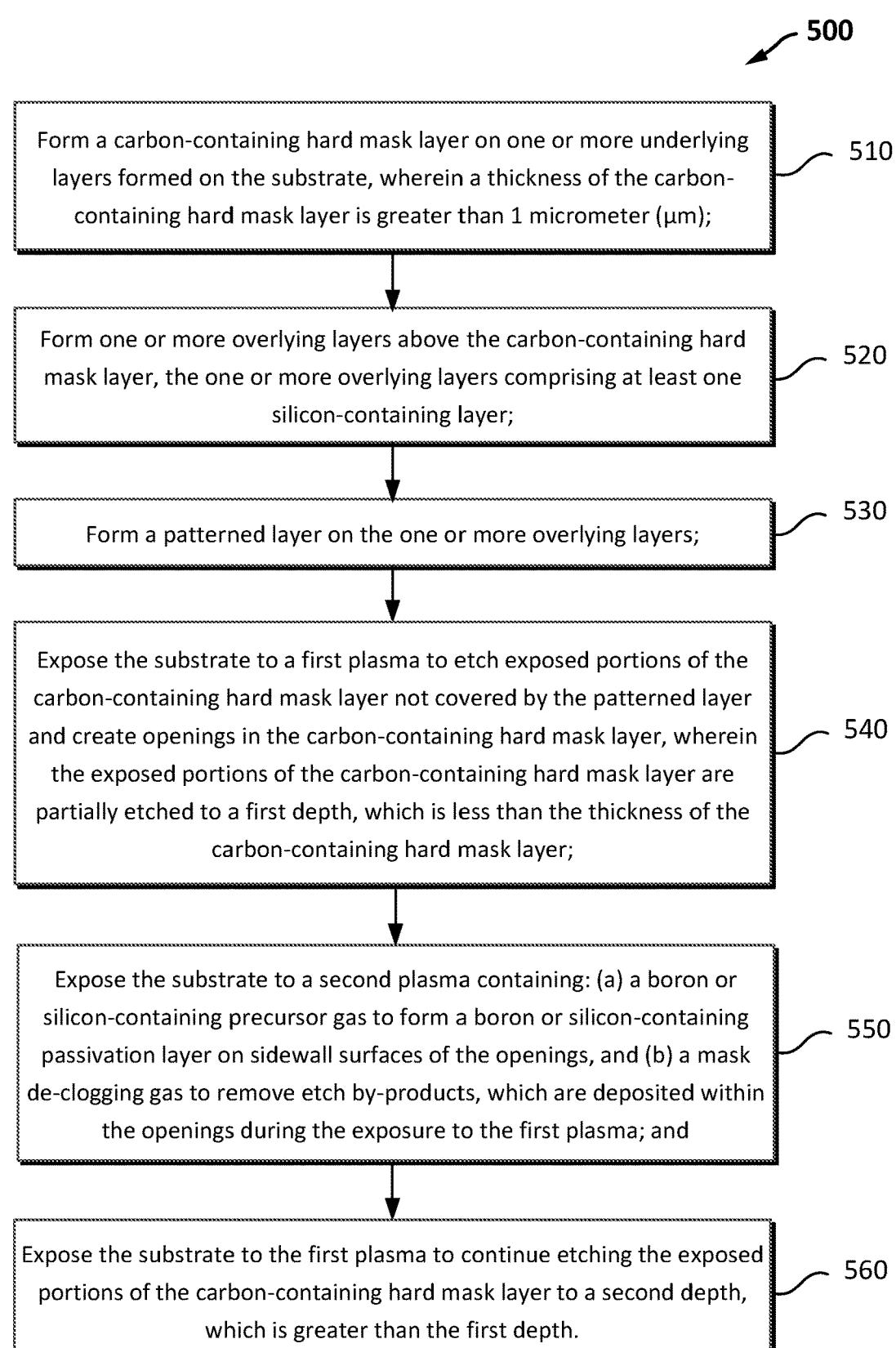

500

Form a carbon-containing hard mask layer on one or more underlying layers formed on the substrate, wherein a thickness of the carbon-containing hard mask layer is greater than 1 micrometer (μm); — 510

Form one or more overlying layers above the carbon-containing hard mask layer, the one or more overlying layers comprising at least one silicon-containing layer; — 520

Form a patterned layer on the one or more overlying layers; — 530

Expose the substrate to a first plasma to etch exposed portions of the carbon-containing hard mask layer not covered by the patterned layer and create openings in the carbon-containing hard mask layer, wherein the exposed portions of the carbon-containing hard mask layer are partially etched to a first depth, which is less than the thickness of the carbon-containing hard mask layer; — 540

Expose the substrate to a second plasma containing: (a) a boron or silicon-containing precursor gas to form a boron or silicon-containing passivation layer on sidewall surfaces of the openings, and (b) a mask de-clogging gas to remove etch by-products, which are deposited within the openings during the exposure to the first plasma; and — 550

Expose the substrate to the first plasma to continue etching the exposed portions of the carbon-containing hard mask layer to a second depth, which is greater than the first depth. — 560

*FIG. 5*

HIGH ASPECT RATIO CARBON LAYER ETCH WITH IMPROVED THROUGHPUT AND PROCESS WINDOW

BACKGROUND

The present disclosure relates to the processing of substrates. In particular, it provides a novel method and process flow for forming a passivation layer on sidewall surfaces of an amorphous carbon layer (ACL) to avoid bowing during an ACL etch process.

As geometries in substrate processing continue to shrink, the technical challenges to forming structures on substrates via photolithography and etch techniques increase. As requirements for smaller geometry structures arose, a variety of techniques have been utilized for achieving suitable structures. Although reduced feature sizes are achieved, pattern performance problems have occurred in some conventional small geometry patterning and etch methods.

For example, photolithography techniques have been used to transfer patterns from a patterned layer to an organic mask layer, such as an amorphous carbon layer (ACL) film, underlying the patterned layer. ACL films are often used as a hard mask for patterning underlying layers using a variety of small geometry patterning methods. However, as feature sizes decrease, critical dimensions ("CDs") become smaller and aspect ratios increase, leading to increasingly greater etch depths. Accordingly, high ion energy is often required to etch high-aspect ratio features (such as vias, contact holes and lines) in ACL films and underlying layers. When etching high-aspect ratio features, the thickness of the ACL film may be increased to withstand etching of the underlying layers. Increasing the thickness of the ACL, however, can create defects in the etched features.

For example, "bowing" may occur when conventional pattern transfer techniques are used to etch high-aspect ratio features in ACL films. Bowing occurs when plasma ions bombard sidewall surfaces of the ACL film to laterally etch the sidewall surfaces. The "bow CD" is measurement of bowing, which is generally defined as the cross-section or width of an opening formed in a layer in a direction perpendicular to the thickness of the layer. When bowing occurs, the bow CD is typically larger near the top of the layer than the bottom of the layer.

FIG. 1 (PRIOR ART) illustrates how bowing may occur when conventional pattern transfer processes are used to etch high-aspect features in an ACL film. As shown in FIG. 1, patterned substrate 100 may generally include a patterned layer 108 formed over a hard mask layer 106, which in turn, is formed over one or more underlying layers, such as an oxide layer 104 and base substrate layer 102. The patterned layer 108, oxide layer 104 and base substrate layer 102 may be formed from any of a wide variety of materials, as is known in the art. The hard mask layer 106 is an amorphous carbon layer (ACL) film, which is used as a hard mask for transferring a pattern from the patterned layer 108 to the underlying oxide layer 104.

In conventional pattern transfer processes, the patterned substrate 100 is exposed to light during a lithography step, and a wet or dry etch process is performed after the lithography step to remove the exposed portions of the hard mask layer 106 to create openings 110. When a dry process is used, a process gas is converted by high-energy power into plasma and ions, which bombard exposed portions of the hard mask layer 106 to create the openings 110 in the hard mask layer 106. Although ion bombard is primarily anisotropic, ion scattering caused by collision of molecules in the plasma may lead to lateral etching of the opening 110 sidewalls and bowing. As shown in FIG. 1, the bow CD is generally larger near the top of the hard mask layer 106 underlying the patterned layer 108. When significant bowing occurs, the hard mask layer 106 may collapse, closing the openings 110.

FIGS. 2A-2F illustrate a conventional solution used to prevent bowing during an ACL etch process. In FIG. 2A, a patterned substrate 200 is formed including a patterned layer 208, a hard mask layer 206, an oxide layer 204 and a base substrate layer 202, as described above in reference to FIG. 1. In FIG. 2B, the patterned substrate 200 is exposed to light during a lithography step, and a dry etch process 212 is performed to remove exposed portions of the hard mask layer 206 and create openings 210. The dry etch process 212 shown in FIG. 2B may remove some, but not all, of the exposed portions of the hard mask layer 206. For example, the dry etch process 212 may etch the exposed portions of the hard mask layer 206 to a first etch depth (d1), as shown in FIG. 2B.

In FIG. 2C, an atomic layer deposition (ALD) process 214 or other plasma process is used to deposit a passivation layer 216 onto the bottom and sidewall surfaces of the openings 210 formed in the hard mask layer 206 to prevent the sidewall surfaces of the hard mask layer 206 from bowing when the dry etch process 212 is subsequently resumed in FIG. 2D. After depositing the passivation layer 216 (in FIG. 2C), the dry etch process 212 is resumed to continue etching the openings 210 in the hard mask layer 206. When the dry etch process 212 is subsequently resumed (in FIG. 2D), the passivation layer 216 protects the sidewall surfaces of the hard mask layer 206 from ion bombardment and lateral etching.

The ALD process 214 used to form the passivation layer 216 is a cyclical deposition process used to deposit one or more monolayers of material onto a surface at a time. In a typical ALD process, a first precursor gas is introduced into a process chamber for a period of time until a saturated monolayer is formed on the substrate. Then, the first precursor gas is purged from the chamber using an inert gas to prevent the first precursor gas from mixing with a subsequent precursor gas species. After the chamber is purged, a second precursor gas is introduced into the chamber, also for a period of time, thus forming a layer on the substrate from the reaction of the second precursor gas with the monolayer formed on the substrate. Then, the second precursor gas is purged from the chamber and the process of introducing the first precursor gas, purging the process chamber, introducing the second precursor gas, and purging the process chamber is often repeated a number of times to achieve a desired film thickness. The ALD process 214 may use a wide variety of precursor gases to form the passivation layer 216 on exposed surfaces of the hard mask layer 206. For example, precursor gases containing silicon, boron, metals (such as aluminum or tungsten), or metal halides (such as tungsten halides, molybdenum halides and titanium halides) have been used.

While conventional ACL etch processes reduce bowing in the hard mask layer 206 and result in substantially vertical openings 210, as shown in FIG. 2F, such processes suffer from various disadvantages. First, ALD processes are relatively time consuming, due to the cyclical nature of the process. Thus, throughput is reduced when the ALD process 214 is used to form the passivation layer 216 on the sidewall surfaces of the hard mask layer 206, as shown in FIG. 2C. The ALD process 214 may also contribute to sidewall roughness, which may negatively impact the performance of the openings 210 (e.g., vias or contact holes) formed within the hard mask layer 206.

In some cases, etch by-products from the dry etch process 212 may adhere to and build up near the top of the openings 210, thereby clogging the openings 210 formed within the hard mask layer 206 and reducing the CD. In order to avoid undesirable reductions in CD, an additional etch process 218 may be added to the ACL etch process to "de-clog" the hard mask openings, as shown in FIG. 2E. In some cases, the ALD process 214 shown in FIG. 20, the dry etch process 212 shown in FIG. 2D and the additional etch process 218 shown in FIG. 2E may each be repeated one or more times, in a cyclical manner, until the openings 210 etched in the hard mask layer 206 reach the oxide layer 204, as shown in FIG. 2F. The cyclical passivation/etch/de-clog steps further reduce throughput of the ACL etch process.

SUMMARY

Improved process flows and methods are provided in the present disclosure for etching high aspect ratio (HAR) features in carbon-containing hard mask layers. More specifically, the present disclosure provides various embodiments of improved process flows and methods that combine sidewall passivation and mask de-clogging steps in a single plasma process step to improve throughput when etching HAR features (such as vias, contact holes, trenches, etc.) within a carbon-containing hard mask layer. In doing so, the improved process flows and methods disclosed herein protect the sidewall surfaces of the carbon-containing hard mask layer and prevent bowing during the HAR etch process, while also reducing processing time and improving throughput.

In the present disclosure, a substrate is provided with a stacked structure comprising a carbon-containing hard mask layer formed on top of one or more underlying layers formed on the substrate, one or more overlying layers formed on the carbon-containing hard mask layer and a patterned layer formed on the one or more overlying layers. In some embodiments, the carbon-containing hard mask layer may be an amorphous carbon layer (ACL) having a thickness greater than 1 micrometer ($\mu$m), the one or more underlying layers may be a dielectric layer (or dielectric layer stack) having a thickness greater than 1 $\mu$m, and the one or more overlying layers may include at least one silicon-containing layer, such as but not limited to, a silicon-containing hard mask layer.

In the embodiments disclosed herein, the substrate is exposed to a first plasma to partially etch exposed portions of the carbon-containing hard mask layer (i.e., portions not covered by the patterned layer) to a first depth to create openings within the carbon-containing hard mask layer. After exposing the substrate to the first plasma to the create openings within the carbon-containing hard mask layer, the embodiments disclosed herein expose the patterned substrate to a second plasma containing: (a) a passivation precursor gas to form a passivation layer on sidewall surfaces of the openings, and (b) a mask de-clogging gas to remove etch by-products, which are deposited within the openings during exposure to the first plasma. By exposing the substrate to the passivation precursor gas and the mask de-clogging gas in a single plasma process step, the embodiments disclosed herein prevent bowing during the HAR etch process, while reducing processing time and improving throughput.

A wide variety of process gases may be used in the second plasma to form a passivation layer and remove the etch by-products clogging the openings. The passivation precursor gas included within the second plasma may be a boron or silicon-containing precursor gas, such as a boron halide, a silicon halide, a borane or a silane.

When the substrate is exposed to a second plasma comprising a boron or silicon-containing precursor gas, a boron or silicon-containing passivation layer is formed on the sidewall surface of the openings. As described further herein, using a boron or silicon-containing precursor gas may provide a larger process window than a metal or metal halide precursor gas.

The mask de-clogging gas included within the second plasma may generally include process gas(es) that selectively etch the etch by-products, which are deposited within the openings during HAR etch process. The process gas(es) used as a mask de-clogging gas may generally depend on the process gas(es) utilized to generate the first plasma and the material composition of the one or more overlying layers. In some embodiments, for example, an oxygen-based plasma may be used to etch the exposed portions of the carbon-containing hard mask layer to create openings within the carbon-containing hard mask layer. When an oxygen-based plasma to create the openings in the carbon-containing hard mask layer, the oxygen-based plasma may also etch exposed portions of the at least one silicon-containing layer overlying the carbon-containing hard mask layer and create silicon oxide etch by-products, which are deposited within the openings. In such embodiments, a fluorocarbon-containing gas or a hydrofluorocarbon-containing gas may be utilized as the mask de-clogging gas to selectively etch the silicon oxide etch by-products and remove the silicon oxide by-products clogging the openings.

According to one embodiment, a method is provided for patterning a substrate. The method may begin by forming a carbon-containing hard mask layer on one or more underlying layers formed on the substrate, forming one or more overlying layers above the carbon-containing hard mask layer, the one or more overlying layers comprising at least one silicon-containing layer, and forming a patterned layer on the one or more overlying layers.

The carbon-containing hard mask layer may be an amorphous carbon layer (ACL) hard mask layer, an Advanced Patterning Film (APF) or another carbon-containing hard mask material that exhibits good etch selectivity to the one or more underlying layers. In some embodiments, the thickness of the carbon-containing hard mask layer may be greater than 1 micrometer ($\mu$m). For example, the thickness of the carbon-containing hard mask layer may range between 1 $\mu$m and 4 $\mu$m.

After forming the various layers as described above, the method may expose the substrate to a series of plasma steps to etch openings within exposed portions of the carbon-containing hard mask layer. For example, the method may expose the substrate to a first plasma to etch exposed portions of the carbon-containing hard mask layer not covered by the patterned layer and create openings in the carbon-containing hard mask layer. When exposed to the first plasma, the exposed portions of the carbon-containing hard mask layer are partially etched to a first depth, which is less than the thickness of the carbon-containing hard mask layer.

After exposing the substrate to the first plasma to create the openings in the carbon-containing hard mask layer, the substrate may be exposed to a second plasma to form a passivation layer on sidewall surfaces of the openings and remove any etch by-products, which may adhere to and clog the openings created in the carbon-containing hard mask layer. For example, the substrate may be exposed to a second plasma containing: (a) a boron or silicon-containing precursor gas to form a boron or silicon-containing passivation layer on sidewall surfaces of the openings, and (b) a mask de-clogging gas to remove any etch by-products, which are deposited within the openings during the exposure to the first plasma.

After forming the boron or silicon-containing passivation layer, the method may re-expose the substrate to the first plasma to continue etching the exposed portions of the carbon-containing hard mask layer to a second depth, which is greater than the first depth. In some embodiments, method may repeat said exposing the substrate to the second plasma and said exposing the substrate to the first plasma to continue etching the exposed portions of the carbon-containing hard mask layer for a number of cycles or until the exposed portions of the carbon-containing hard mask layer are completely removed.

In some embodiments, the first plasma may be an oxygen-based plasma. When the substrate is exposed to a first plasma comprising oxygen, the oxygen-based plasma: (a) etches the exposed portions of the carbon-containing hard mask layer not covered by the patterned layer to create the openings in the carbon-containing hard mask layer, and (b) etches exposed portions of the at least one silicon-containing layer, which creates silicon oxide etch by-products that are deposited within the openings.

In some embodiments, the mask de-clogging gas comprises a fluorocarbon or a hydrofluorocarbon. For example, the mask de-clogging gas may comprise hexafluorobutadiene ($C_4F_6$), perfluorocyclobutane ($C_4F_8$), hexafluoroethane ($C_2F_6$), tetrafluoromethane ($CF_4$), hexafluoropropylene ($C_3F_6$), trifluoromethane ($CHF_3$), difluoromethane ($CH_2F_2$) or monofluoromethane ($CH_3F$). When the substrate is exposed to a second plasma comprising a fluorocarbon or hydrofluorocarbon mask de-clogging gas, fluorocarbon radicals within the second plasma selectively etch the silicon oxide etch by-products to remove the silicon oxide etch by-products deposited within the openings.

According to another embodiment, another method is provided for patterning a substrate. The method may begin by forming an amorphous carbon layer (ACL) hard mask layer on one or more underlying layers formed on the substrate, forming one or more overlying layers above the ACL hard mask layer, the one or more overlying layers comprising at least one silicon-containing layer, and forming a patterned layer on the one or more overlying layers. In some embodiments, the thickness of the ACL hard mask layer may be greater than 1 micrometer (μm). For example, the thickness of the ACL hard mask layer may range between 1 μm and 4 μm.

After forming the various layers as described above, the method may expose the substrate to a series of plasma steps to etch openings within exposed portions of the ACL hard mask layer. For example, the method may expose the substrate to a first plasma comprising an oxygen-containing gas to etch exposed portions of the ACL hard mask layer not covered by the patterned layer and create openings in the ACL hard mask layer. When exposed to the first plasma, the exposed portions of the ACL hard mask layer are partially etched to a first depth, which is less than the thickness of the ACL hard mask layer.

After exposing the substrate to the first plasma to create the openings in the ACL hard mask layer, the substrate may be exposed to a second plasma to form a passivation layer on sidewall surfaces of the openings and remove any material, which may adhere to and clog the openings created in the ACL hard mask layer. For example, the substrate may be exposed to a second plasma containing: (a) a boron-containing precursor gas to form a boron-containing passivation layer on sidewall surfaces of the openings, and (b) a fluorocarbon-containing gas to remove silicon oxide material, which is deposited within the openings during the exposure to the first plasma. During said exposing the substrate to the second plasma, fluorocarbon radicals within the second plasma selectively etch the silicon oxide material to remove the silicon oxide material deposited within the openings.

After forming the boron-containing passivation layer, the method may re-expose the substrate to the first plasma to continue etching the exposed portions of the ACL hard mask layer to a second depth, which is greater than the first depth. In some embodiments, method may repeat said exposing the substrate to the second plasma and said exposing the substrate to the first plasma to continue etching the exposed portions of the ACL hard mask layer for a number of cycles or until the exposed portions of the ACL hard mask layer are completely removed.

The methods described herein may use a wide variety of process gases to generate the second plasma used to form the sidewall passivation layer and remove etch by-products to de-clog the openings created within in the carbon-containing (e.g., ACL) hard mask layer.

In some embodiments, the methods described herein may use a boron-containing precursor gas or a silicon-containing precursor gas, such as a boron halide, a silicon halide, a borane or a silane, to form the sidewall passivation layer. Examples of boron halides and silicon halides that may be used to form the sidewall passivation layer include, but are not limited to, boron trichloride ($BCl_3$), boron trifluoride ($BF_3$), boron tribromide ($BBr_3$), tetrachlorosilane ($SiCl_4$) and tetrafluorosilane ($SiF_4$). Examples of boranes and silanes include borane ($BH_3$), silane ($SiH_4$), chlorosilane ($SiClH_3$), dichlorosilane ($SiCl_2H_2$), trichlorosilane ($SiCl_3H$), disilane ($Si_2H_6$), monochlorodisilane ($Si_2ClH_5$), dichlorodisilane ($Si_2Cl_2H_4$), trichlorodisilane ($Si_2Cl_3H_3$), tetrachlorodisilane ($Si_2Cl_4H_2$), pentachlorodisilane ($Si_2Cl_5H$) or hexachlorodisilane ($Si_2Cl_6$). Other boron or silicon-containing precursor gases may also be utilized.

In some embodiments, the methods described herein may use a fluorocarbon or hydrofluorocarbon gas (e.g., a mask de-clogging gas) to selectively remove etch by-products from the openings created within the carbon-containing (e.g., ACL) hard mask layer. Examples of fluorocarbon and hydrofluorocarbon gases include, but are not limited to, hexafluorobutadiene ($C_4F_6$), perfluorocyclobutane ($C_4F_8$), hexafluoroethane ($C_2F_6$), tetrafluoromethane ($CF_4$), hexafluoropropylene ($C_3F_6$), trifluoromethane ($CHF_3$), difluoromethane ($CH_2F_2$) or monofluoromethane ($CH_3F$). In some embodiments, oxygen ($O_2$) and/or an inert gas (e.g., $N_2$, Ar, He, Ne, Kr, Xe, etc.) may be added to the fluorocarbon or hydrofluorocarbon gas chemistry.

In some embodiments of the methods described herein, the second plasma may be generated by combining a boron halide with a fluorocarbon, such that the second plasma comprises a substantially equal amount of boron halide radicals and fluorocarbon radicals. For example, the second plasma may be generated by combining boron trichloride ($BCl_3$) and hexafluorobutadiene ($C_4F_6$), such that the second plasma includes a substantially equal amount of boron dichloride ($BCl_2$) radicals and difluoromethylene ($CF_2$) radicals.

In some embodiments of the methods described herein, the gas flow rate of the boron or silicon-containing precursor gas may range between 20% to 70%, between 30% to 60%, or between 45% to 55% of a combined gas flow of the process gases used to generate the second plasma. By restricting the gas flow rate of the boron or silicon-containing precursor gas to an appropriate range, the radicals generated within the second plasma may provide sufficient sidewall passivation on the openings formed within the carbon-containing hard mask layer, while preventing erosion of silicon-containing layer(s) overlying the carbon-containing hard mask layer. In some embodiments, the second plasma may be generated by combining boron trichloride ($BCl_3$), hexafluorobutadiene ($C_4F_6$) and oxygen ($O_2$), and the $BCl_3$ gas flow may range between 20% and 70% of a combined gas flow of the $BCl_3$, $C_4F_6$ and $O_2$. In one example embodiment, the $BCl_3$ gas flow may be approximately 50% of the combined gas flow of $BCl_3$, $C_4F_6$ and $O_2$.

Various embodiments of methods are provided herein for patterning a substrate, and more specifically, for improving throughput and process window when etching HAR features within a carbon-containing hard mask layer. Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed inventions. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 3A-3D illustrate an improved pattern transfer process that prevents bowing during an ACL etch process, while improving throughput, by combining passivation and de-clog in a single plasma process step.

FIG. 5 is a flowchart diagram illustrating one embodiment of a method to pattern a substrate in accordance with the techniques described herein.

DETAILED DESCRIPTION

Figure 1:
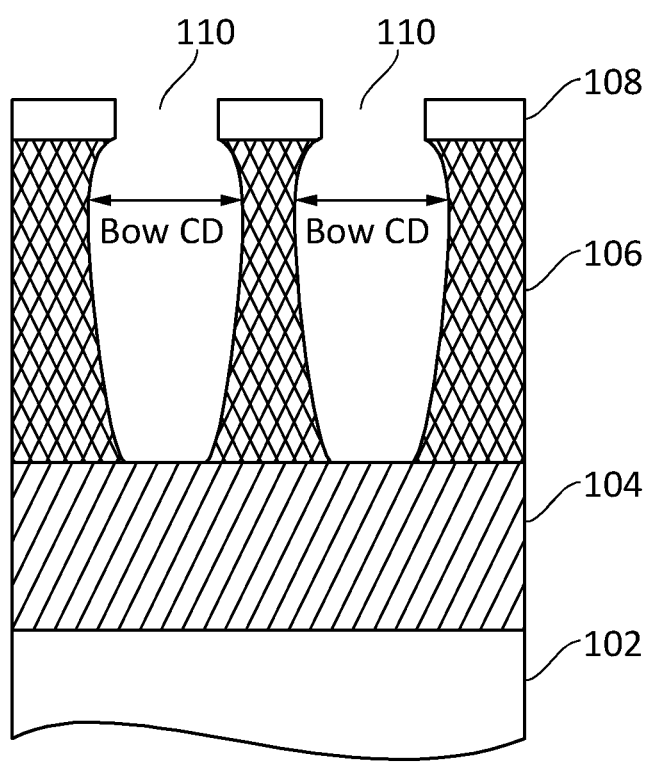
FIG. 1 (PRIOR ART) is a cross-sectional view of a patterned substrate illustrating the bowing that occurs when conventional pattern transfer processes are used to etch high-aspect features in an amorphous carbon layer (ACL) film.
Figure 2A:
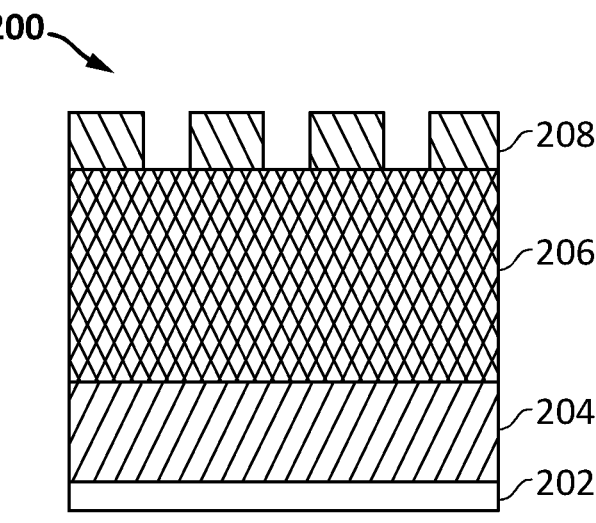
FIGS. 2A-2F (PRIOR ART) illustrate a conventional pattern transfer process that prevents bowing during an ACL etch process by performing separate passivation/etch/de-clog steps in a cyclical manner.
Figure 2B:
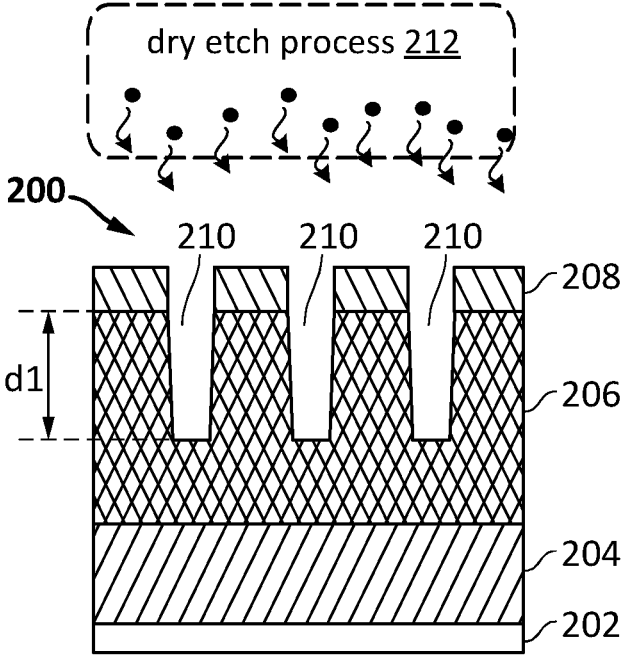
Figures 2C, 2D, 2E, 2F:
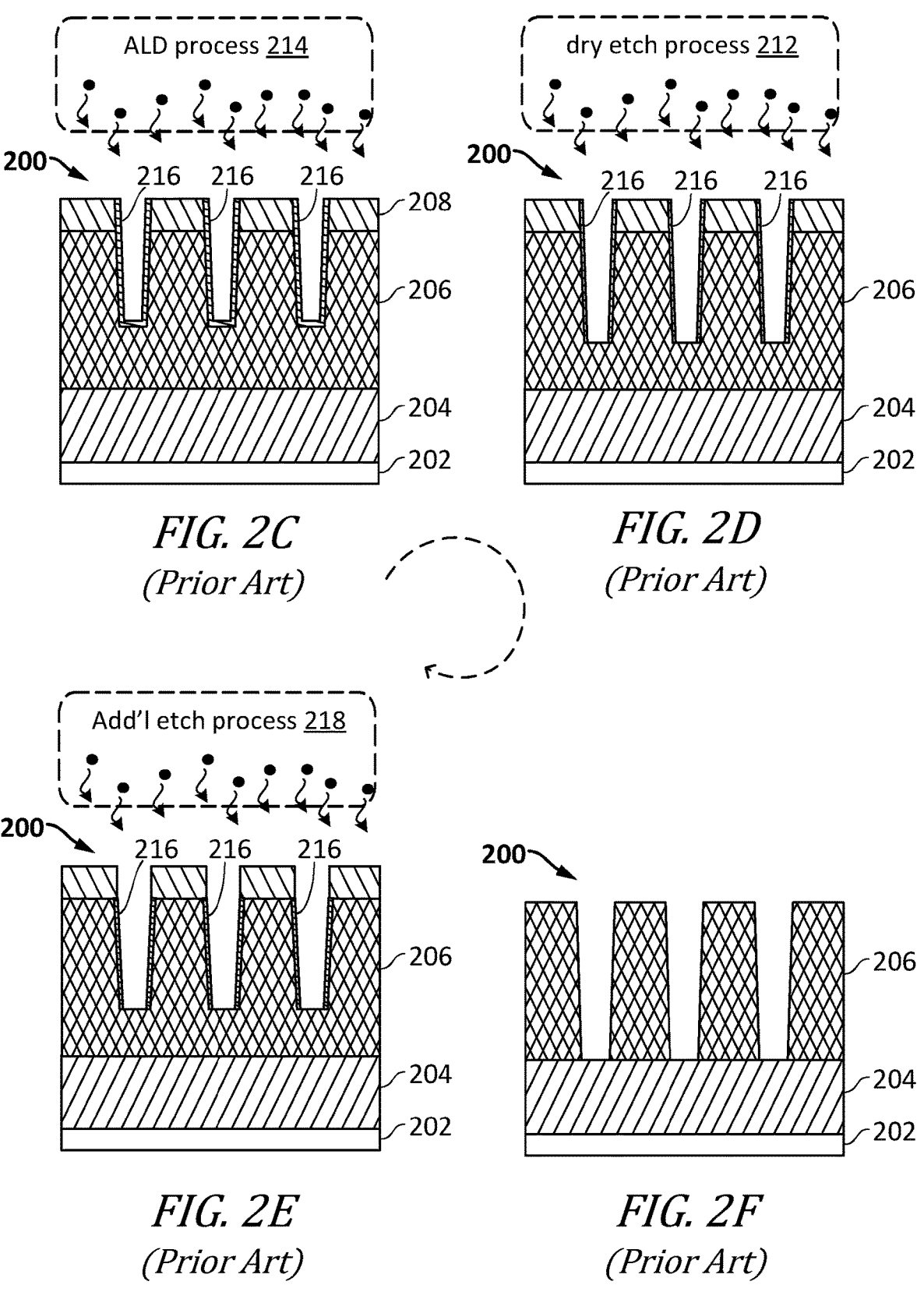

Improved process flows and methods are provided in the present disclosure for etching high aspect ratio (HAR) features in carbon-containing hard mask layers. More specifically, the present disclosure provides various embodiments of improved process flows and methods that combine sidewall passivation and mask de-clogging steps in a single plasma process step to improve throughput when etching HAR features (such as vias, contact holes, trenches, etc.) within a carbon-containing hard mask layer. In doing so, the improved process flows and methods disclosed herein protect the sidewall surfaces of the carbon-containing hard mask layer and prevent bowing during the HAR etch process, while also reducing processing time and improving throughput.

In the present disclosure, a substrate is provided with a stacked structure comprising a carbon-containing hard mask layer formed on top of one or more underlying layers formed on the substrate, one or more overlying layers formed on the carbon-containing hard mask layer and a patterned layer formed on the one or more overlying layers. In some embodiments, the carbon-containing hard mask layer may be an amorphous carbon layer (ACL) having a thickness greater than 1 micrometer ($\mu m$), the one or more underlying layers may be a dielectric layer (or dielectric layer stack) having a thickness greater than 1 $\mu m$, and the one or more overlying layers may include at least one silicon-containing layer, such as but not limited to, a silicon-containing hard mask layer.

In the embodiments disclosed herein, the substrate is exposed to a first plasma to partially etch exposed portions of the carbon-containing hard mask layer (i.e., portions not covered by the patterned layer) to a first depth to create openings within the carbon-containing hard mask layer. After exposing the substrate to the first plasma to the create openings within the carbon-containing hard mask layer, the embodiments disclosed herein expose the patterned substrate to a second plasma containing: (a) a passivation precursor gas to form a passivation layer on sidewall surfaces of the openings, and (b) a mask de-clogging gas to remove any etch by-products, which may be deposited within the openings during exposure to the first plasma. By exposing the substrate to the passivation precursor gas and the mask de-clogging gas in a single plasma process step, the embodiments disclosed herein prevent bowing during the HAR etch process, while reducing processing time and improving throughput.

A wide variety of process gases may be used in the second plasma to form a passivation layer and remove any etch by-products clogging the openings. The passivation precursor gas included within the second plasma may be a boron or silicon-containing precursor gas, such as a boron halide, a silicon halide, a borane or a silane. When the substrate is exposed to a second plasma comprising a boron or silicon-containing precursor gas, a boron or silicon-containing passivation layer is formed on the sidewall surface of the openings. As described in more detail below, the boron or silicon-containing precursor gases used herein may provide a larger process window than a metal or metal halide precursor gas.

The mask de-clogging gas included within the second plasma may generally include process gas(es) that selectively etch the etch by-products, which are deposited within the openings during HAR etch process. The process gas(es) used as a mask de-clogging gas may generally depend on the process gas(es) utilized to generate the first plasma and the material composition of the one or more overlying layers. In some embodiments, for example, an oxygen-based plasma may be used to etch the exposed portions of the carbon-containing hard mask layer to create openings within the carbon-containing hard mask layer. When an oxygen-based plasma to create the openings in the carbon-containing hard mask layer, the oxygen-based plasma may also etch exposed portions of the at least one silicon-containing layer overlying the carbon-containing hard mask layer and create silicon oxide etch by-products, which are deposited within the openings. In such embodiments, a fluorocarbon-containing gas or a hydrofluorocarbon-containing gas may be utilized as the mask de-clogging gas to selectively etch the silicon oxide etch by-products and remove the silicon oxide by-products clogging the openings.

FIGS. 3A-3D illustrate one embodiment of an improved process flow that utilizes the techniques disclosed herein for etching high aspect ratio (HAR) features in a carbon-containing hard mask layer. It will be recognized that the embodiment shown in FIGS. 3A-3D is merely exemplary and the techniques described herein may be applied to other process flows.

Figure 3A:
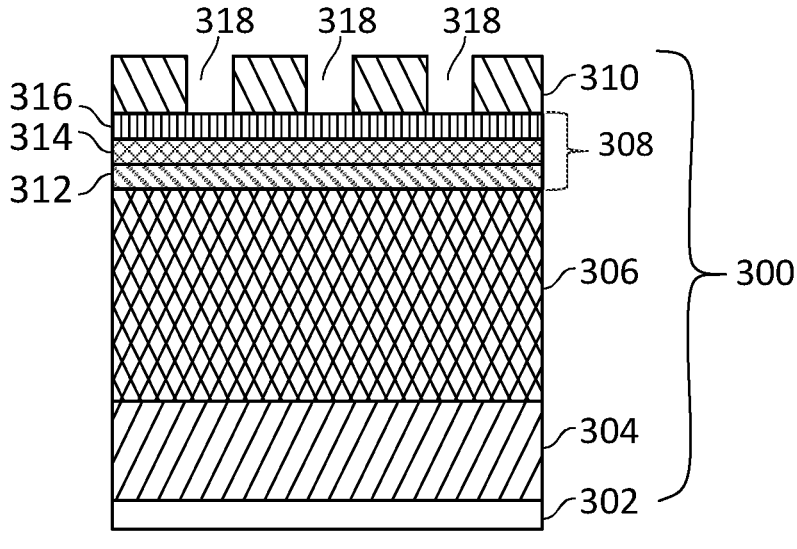

FIG. 3A provides a cross-section view through a stacked structure 300 in accordance with one embodiment of the present disclosure. FIGS. 3A-3D illustrate one embodiment of an HAR etch process 350 that may be used to etch a pattern of openings 318 (e.g., contact holes, vias, trenches, etc.) within a carbon-containing hard mask layer 306 of a stacked structure 300 formed on a substrate. In FIGS. 3A-3D, cross-section views are provided for example embodiments of stacked structures and process steps that can be used to etch the openings 318 within the carbon-containing hard mask layer 306, while reducing processing time and improving throughput of the HAR etch process. It is noted that these cross-section views are in a first direction perpendicular to the openings 318 being formed in the stacked structure 300. In one embodiment, a plasma processing system may be utilized to perform one or more of the process steps shown in FIGS. 3A-3D.

In some embodiments, the process steps shown in FIGS. 3A-3D can be used as part of a 3D memory fabrication process, illustrating process steps used to "open" a relatively thick (e.g., >1 µm) carbon-containing hard mask layer 306 to provide a pattern of openings 318 (e.g., contact holes, vias, trenches, etc.) to be transferred to a relatively thick (e.g., >1 µm) dielectric layer or multilayer stack underlying the carbon-containing hard mask layer 306. It is recognized that the material layers and layer depths shown in FIGS. 3A-3D are illustrated for explanatory purposes and not drawn to scale.

FIG. 3A illustrates a process step where the stacked structure 300 has been formed on a base substrate 302. As shown in FIG. 3A, the stacked structure 300 may generally include, but is not limited to, one or more underlying layers 304 formed on the base substrate 302, a carbon-containing hard mask layer 306 formed on the underlying layer(s) 304, one or more overlying layers 308 formed above the carbon-containing hard mask layer 306 and a patterned layer 310 formed on the one or more overlying layers 308.

Base substrate 302 may be any substrate for which the use of patterned features is desirable. For example, base substrate 302 may be a semiconductor substrate having one or more semiconductor processing layers formed thereon. In one embodiment, base substrate 302 may be a substrate that has been subject to multiple semiconductor processing steps which yield a wide variety of structures and layers, all of which are known in the substrate processing art.

The one or more underlying layers 304 may generally include a dielectric material (such as, e.g., an oxide). In some embodiments, the underlying layer(s) 304 may include a relatively thick (e.g., a few µm to 25 µm) dielectric layer, such as an oxide or silicon dioxide ($SiO_2$) layer. In other embodiments, the underlying layer(s) 304 may be implemented as a multilayer vertical stack comprising alternating layers of dielectric and conductive materials, such as for example, alternating layers of oxide and nitride (ONON), alternating layers of silicon oxide and polysilicon (OPOP), etc. In some embodiments, the stacked structure 300 shown in FIG. 3A may be used within a 3D stacked semiconductor memory, such as a 3D NAND flash memory device or the like. In some embodiments, the one or more underlying layers 304 may be deposited to a thickness or depth ranging, for example, between 1 µm to 25 µm. In one example embodiment, a deposition thickness of the one or more underlying layers 304 may be approximately 6 µm.

The carbon-containing hard mask layer 306, which is formed above and in contact with a dielectric material layer of the underlying layer(s) 304, may be an amorphous carbon layer (ACL) hard mask layer, an Advanced Patterning Film (APF) (commercially available from Applied Materials) or another carbon-containing hard mask material that exhibits good etch selectivity to dielectric. A wide variety of ACL hard mask materials and other carbon-containing hard mask materials may be utilized. For example, a variety of ACL hard mask materials having different carbon:hydrogen ratios may be considered. As known in the art, the amount of hydrogen included within a given ACL hard mask material determines its optical properties, as well as its etch resistance to a given etch chemistry. As the amount of hydrogen decreases, certain optical properties (such as the absorption coefficient, k) of the ACL hard mask material increase. Likewise, as the amount of hydrogen decreases, the etch resistance of the ACL hard mask material may also increase (depending on the etch chemistry used), leading to a decreased etch rate. In some embodiments, a carbon-containing hard mask material (e.g., an ACL hard mask material or another carbon-containing hard mask material) having a desired etch resistance, and thus, a desired mask selectivity (e.g., a mask selectivity greater than 3), for a given etch chemistry may be selected for use within the carbon-containing hard mask layer 306.

In some embodiments, the carbon-containing hard mask layer 306 may be an ACL, which is deposited to a thickness or depth ranging, for example, between 1 µm and 4 µm. In one example embodiment, a 2.5-3 µm thick ACL may be utilized for etching an approximately 6 µm thick multilayer vertical stack comprising alternating layers of oxide and nitride (ONON). In such an embodiment, the ACL may exhibit an etch selectivity of at least 7:1 to the underlying ONON layers when a fluorocarbon etch chemistry (containing, e.g., CxFy) is used to etch the ONON layers. It is recognized, however, that the etch selectivity of the carbon-containing hard mask layer 306 to the underlying layer(s) 304 may differ from the example provided above, depending on the material composition of the carbon-containing hard mask layer 306, the material composition of the underlying layer(s) 304 and the etch chemistry used to etch the underlying layer(s) 304.

A wide variety of overlying layer(s) 308 may be formed above the carbon-containing hard mask layer 306. In the example embodiment shown in FIG. 3A, the overlying layer(s) 308 include an additional hard mask layer 312, an organic dielectric layer (ODL) 314 and an antireflective coating (ARC) layer 316. A patterned layer 310, such as photoresist (PR) layer, is formed above the overlying layer(s) 308 and used to etch a pattern of openings 318 within the overlying layer(s) 308 and the carbon-containing hard mask layer 306. Other layers may also be included within the stacked structure 300, as is known in the art.

A wide variety of materials may be used to form the layers 310, 312, 314 and 316. For example, the additional hard mask layer 312 may include, but is not limited to, oxide, silicon nitride (SIN), silicon oxynitride (SiON), silicon oxide (SiO), doped SiO, titanium (Ti), and titanium nitride (TiN). The ODL 314 may include an organic planarization layer (OPL) ODL (commercially available from Shin-etsu Chemical, Co., Ltd). The ARC layer 316 may include a silicon-containing ARC (SiARC) or a bottom ARC (BARC). The patterned layer 310 may be formed from any of a wide variety of photoresist materials commonly used in lithography. The patterned layer 310 may be formed by depositing one or more layers of photoresistive material onto the overlying layer(s) 308 and then patterning the photoresist layer(s), using a lithography technique, to form the openings 318 within the photoresist layer(s), thus creating a photoresist pattern. A wide variety of deposition processes and lithography techniques may be used to form the patterned layer 310, as is well known in the art.

In one example embodiment, the stacked structure 300 shown in FIG. 3A may include a 40-60 nm patterned layer 310, a 20-40 nm ARC layer 316, a 200-400 nm ODL 314, a 100-400 nm additional hard mask layer 312, a 1-4 μm carbon-containing hard mask layer 306 and a 1-25 μm underlying layer(s) 810, all of which is formed on a silicon base substrate 302. It is recognized that other layers, or additional layers, may also be used within the stacked structure 300, as is known in the art.

A wide variety of deposition techniques may be used to form the individual layers included within the stacked structure 300 shown in FIG. 3A. For example, these layers can be formed using one or more deposition processes including an atomic layer deposition (ALD) process, a chemical vapor deposition (CVD) process, a plasma enhanced CVD (PECVD) process, a physical vapor deposition (PVD) process, or other deposition processes or combinations of processes. The deposition process steps used to form the layers 304, 306, 310, 312, 314, and 316 may be performed using the same (or different) deposition technique (e.g., ALD, CVD, etc.) and suitable process gases. Such techniques and process gases are known to those skilled in the art.

After the layers 304, 306, 308 and 310 are formed on the base substrate 302, as shown in FIG. 3A, a HAR etch process 350 may be performed to extend the openings 318 formed within the patterned layer 310 through the overlying layer(s) 308 and the carbon-containing hard mask layer 306. One embodiment of the HAR etch process 350 is shown in FIGS. 3B-3D.

Figure 3B:
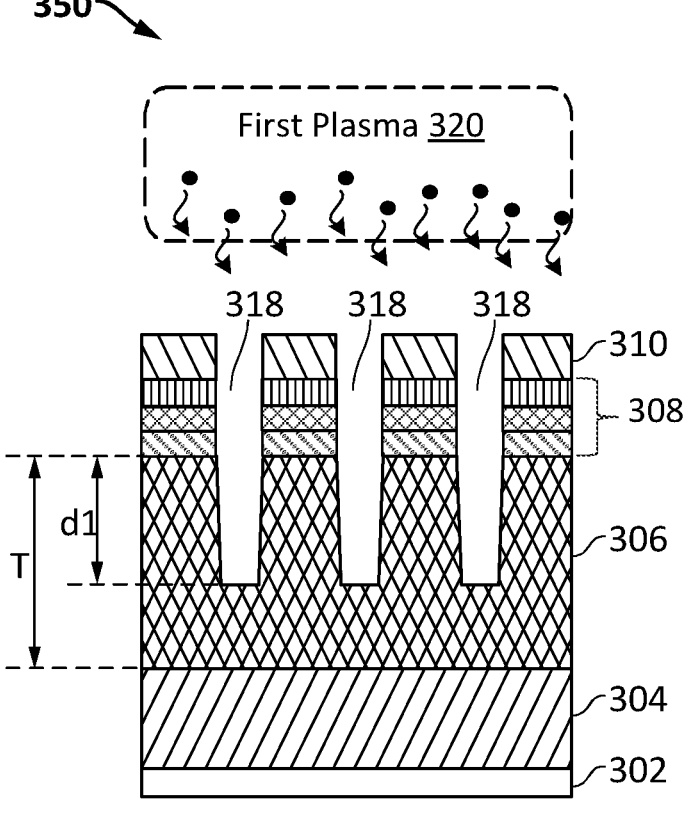

As shown in FIG. 3B, the HAR etch process 350 may begin by exposing the substrate comprising the stacked structure 300 to a first plasma 320 to etch exposed portions of the carbon-containing hard mask layer 306 (i.e., portions of the carbon-containing hard mask layer 306 not protected by the patterned layer 310) and create openings 318 in the carbon-containing hard mask layer 306. When exposed to the first plasma 320 in FIG. 3B, the exposed portions of the carbon-containing hard mask layer 306 may be partially etched to a first depth (d1), which is less than the thickness (T) of the carbon-containing hard mask layer 306.

Various etch chemistries may be used to create the openings 318 within the carbon-containing hard mask layer 306, as shown in FIG. 3B. In some embodiments, an etch chemistry comprising oxygen and sulfur-containing gases may be utilized within the first plasma 320 to etch the exposed portions of the carbon-containing hard mask layer 306. Examples of oxygen and sulfur-containing etch chemistries include, but are not limited to, chemistries comprising oxygen ($O_2$), ozone ($O_3$), carbon monoxide (CO), carbon dioxide ($CO_2$), sulfur dioxide ($SO_2$) and carbonyl sulfide (COS). In some embodiments, nitrogen ($N_2$), hydrogen ($H_2$) and/or an inert gas (e.g., $N_2$, Ar, He, Ne, Kr, Xe, etc.) may be added to the etch chemistry used to etch the carbon-containing hard mask layer 306. It is noted that the techniques disclosed herein are not limited to any particular etch chemistry, and any of a wide variety of etch chemistries utilized for etching carbon-containing hard mask layers (including ACL hard mask layers) may be utilized.

In one example embodiment, the first plasma 320 shown in FIG. 3B may be generated by supplying a gas mixture comprising approximately 200 to 300 standard cubic centimeters (sccm) of sulfur dioxide ($SO_2$), approximately 80 to 150 sccm of oxygen ($O_2$) and approximately 20 to 80 sccm of argon (Ar) to a plasma chamber (e.g., a CCP or ICP chamber) in which the substrate is disposed. As known in the art, a plasma may be generated within the plasma chamber by supplying source power from a first radio frequency (RF) source and/or bias power from a second RF source to the plasma chamber, while the gas mixture is supplied to the plasma chamber. In some embodiments, relatively high source power (e.g., 1000 to 1400 W), relatively low bias power (e.g., 100 to 600 W), relatively low chamber pressure (e.g., 10 to 30 mT) and relatively low temperature (e.g., 0 to 60° C.) may be used to generate the first plasma 320 within the plasma chamber. When the gas mixture supplied to the plasma chamber is excited with RF power to generate the first plasma 320, ions generated within the first plasma 320 bombard the exposed portions of the carbon-containing hard mask layer 306 to etch or remove the exposed portions of the carbon-containing hard mask layer 306 to create the openings 318 within the carbon-containing hard mask layer 306.

As noted above, the first plasma 320 shown in FIG. 3B may partially etch the exposed portions of the carbon-containing hard mask layer 306 to a first depth (d1), which is less than the thickness (T) of the carbon-containing hard mask layer 306. In some embodiments, the etch process may be timed to etch the exposed portions of the carbon-containing hard mask layer 306 to the first depth (d1). The etch time and the etch depth may be dependent on several factors, such as the thickness (T) of the carbon-containing hard mask layer 306, the material composition of the carbon-containing hard mask layer 306, the etch chemistry, etc. In some embodiments, the etch time may range between 1 to 4 minutes to achieve a first etch depth (d1) of 500 to 2000 nm. Other etch times and etch depths may also be used. As is known in the art, the etch times may vary depending on amounts and types of compounds in the gas mixture, the bias powers, etc.

After partially etching the exposed portions of the carbon-containing hard mask layer 306 to create the openings 318 within the carbon-containing hard mask layer 306, as shown in FIG. 3B, the HAR etch process 350 may expose the substrate comprising the stacked structure 300 to a second plasma 330 to form a boron or silicon-containing passivation layer 340 on sidewall surfaces of the openings 318. The boron or silicon-containing passivation layer 340 may be formed on sidewall surfaces of the openings 318 by exposing the substrate to a second plasma 330 containing a boron or silicon-containing precursor gas. In some embodiments, the substrate may be exposed to the first plasma 320 and the second plasma 330 within the same plasma chamber.

A wide variety of boron or silicon-containing precursor gases can be used to generate the second plasma 330. In some embodiments, the boron or silicon-containing precursor gas may be a boron halide or a silicon halide. For example, the boron or silicon-containing precursor gas may be boron trichloride ($BCl_3$), boron trifluoride ($BF_3$), boron tribromide ($BBr_3$), tetrachlorosilane ($SiCl_4$) or tetrafluorosilane ($SiF_4$). In other embodiments, the boron or silicon-containing precursor gas may be a borane or a silane. For example, the boron or silicon-containing precursor gas may be borane ($BH_3$), silane ($SiH_4$), chlorosilane ($SiClH_3$), dichlorosilane ($SiCl_2H_2$), trichlorosilane ($SiCl_3H$), disilane ($Si_2H_6$), monochlorodisilane ($Si_2ClH_5$), dichlorodisilane ($Si_2Cl_2H_4$), trichlorodisilane ($Si_2Cl_3H_3$), tetrachlorodisilane ($Si_2Cl_4H_2$), pentachlorodisilane ($Si_2Cl_5H$) or hexachlorodisilane ($Si_2Cl_6$). Other boron or silicon-containing precursor gases may also be utilized.

In one example embodiment, a boron trichloride ($BCl_3$) precursor gas is used to generate the second plasma 330 and form a boron-containing passivation layer on the sidewall surfaces of the openings 318. When a boron trichloride ($BCl_3$) precursor gas is excited with RF power in the presence of other gases, the $BCl_3$ precursor gas dissociates into chlorine (Cl), boron dichloride ($BCl_2$) and boron chloride (BCl) radicals. The boron dichloride ($BCl_2$) and boron chloride (BCl) radicals adsorb onto the sidewall surfaces of the openings 318 to form a boron-containing passivation layer.

In some cases, the etch chemistry used to etch the exposed portions of the carbon-containing hard mask layer 306 (in FIG. 3B) may produce etch by-products. For example, when an oxygen-based etch chemistry is used in the first plasma 320 to etch the exposed portions of the carbon-containing hard mask layer 306 and create the openings 318 in the carbon-containing hard mask layer 306, the first plasma 320 may also etch exposed portions of the overlying layer(s) 308. As noted above, the overlying layer(s) 308 may include at least one silicon-containing layer (e.g., a silicon-containing hard mask layer or a silicon-containing ARC). When an oxygen-based plasma etches a silicon-containing layer, silicon material sputtered from the silicon-containing layer is oxidized to form oxygen-rich silicon oxide etch by-products. The silicon oxide etch by-products may build up near the top of the openings 318, thereby clogging the openings 318 formed within the carbon-containing hard mask layer 306 and reducing the CD, unless steps are taken to remove such material.

In the embodiments disclosed herein, a mask de-clogging gas is added to the second plasma 330 to remove silicon oxide material from the openings 318 to prevent clogging of the openings 318 and avoid undesirable reductions in CD. The mask de-clogging gas included within the second plasma 330 may generally include process gas(es) that selectively etch the etch by-products, which are deposited within the openings 318 during HAR etch process. The process gas(es) used as a mask de-clogging gas may generally depend on the process gas(es) used to generate the first plasma 320 and the material composition of the one or more overlying layers 308. For example, when an oxygen-based etch chemistry is used in the first plasma 320 to etch the exposed portions of the carbon-containing hard mask layer 306 and a silicon nitride (SiN) or silicon oxynitride (SiON) hard mask layer is formed above the carbon-containing hard mask layer 306, the mask de-clogging gas may include etch chemistries that provide selective etching of oxide over nitride.

In some embodiments, a fluorocarbon or hydrofluorocarbon gas may be utilized as the mask de-clogging gas to selectively remove the silicon oxide etch by-products from the openings 318. Examples of fluorocarbon and hydrofluorocarbon gases include, but are not limited to, hexafluorobutadiene ($C_4F_6$), perfluorocyclobutane ($C_4F_8$), hexafluoroethane ($C_2F_6$), tetrafluoromethane ($CF_4$), hexafluoropropylene ($C_3F_6$), trifluoromethane ($CHF_3$), difluoromethane ($CH_2F_2$) or monofluoromethane ($CH_3F$). In some embodiments, oxygen ($O_2$) and/or an inert gas (e.g., $N_2$, Ar, He, Ne, Kr, Xe, etc.) may be added to the fluorocarbon or hydrofluorocarbon gas chemistry.

When a fluorocarbon or hydrofluorocarbon gas is added to the second plasma 330, fluorocarbon radicals within the second plasma 330 selectively etch the silicon oxide etch by-products to remove the silicon oxide etch by-products deposited within the openings 318. In one example embodiment, hexafluorobutadiene ($C_4F_6$), oxygen ($O_2$) and argon (Ar) may be added to the process gases used to generate the second plasma 330. When $C_4F_6$ gas is excited with RF power in the presence of $O_2$ and other gases, the $C_4F_6$ gas dissociates into fluorine (F), $CF_2$, $C_3F_4$, $C_2F_3$ and oxygen (O) radicals. The $CF_2$, $C_3F_4$, $C_2F_3$ radicals selectively etch the silicon oxide etch by-products to remove the silicon oxide etch by-products from the openings 318.

In some embodiments, the second plasma 330 shown in FIG. 3C may be generated by supplying a gas mixture comprising approximately 10 to 175 sccm of boron trichloride ($BCl_3$), approximately 15 to 35 sccm of hexafluorobutadiene ($C_4F_6$), approximately 20 to 40 sccm of oxygen ($O_2$) and approximately 200 to 300 sccm of argon (Ar) to a plasma chamber (e.g., a CCP or ICP chamber) in which the substrate is disposed. In some embodiments, a relatively low source power (e.g., 25 to 100 W), relatively low bias power (e.g., 100 to 600 W), relatively low chamber pressure (e.g., 10 to 30 mT) and relatively low temperature (e.g., 0 to 60° C.) may be used to generate the second plasma 330 within the plasma chamber.

In some embodiments, the $BCl_3$ gas flow rate may range between about 20% to 70% of a combined gas flow of the processes gases (e.g., $BCl_3$, $C_4F_6$ and $O_2$) used to generate the second plasma 330. For example, the process gases used to generate the second plasma 330 may include 25 sccm of hexafluorobutadiene ($C_4F_6$), 30 sccm of oxygen ($O_2$) and approximately 14 to 128 sccm of boron trichloride ($BCl_3$). By restricting the $BCl_3$ gas flow rate to about 20% to 70% of the combined gas flow, the radicals generated within the second plasma 330 may provide sufficient sidewall passivation on the openings 318 formed within the carbon-containing hard mask layer 306, while preventing erosion of silicon-containing layer(s) overlying the carbon-containing hard mask layer 306.

In one embodiment, the $BCl_3$ gas flow rate may be approximately 50% of the combined gas flow of the processes gases (e.g., $BCl_3$, $C_4F_6$ and $O_2$) used to generate the second plasma 330. For example, the process gases used to generate the second plasma 330 may include 25 sccm of hexafluorobutadiene ($C_4F_6$), 30 sccm of oxygen ($O_2$) and 60 sccm of boron trichloride ($BCl_3$). When the $BCl_3$ gas flow rate is approximately 50% of the combined gas flow of the processes gases (e.g., $BCl_3$, $C_4F_6$ and $O_2$) used to generate the second plasma 330, the second plasma 330 may include a substantially equal amount of boron dichloride ($BCl_2$) radicals and difluoromethylene ($CF_2$) radicals.

While examples are provided above to illustrate the inventive concepts, other gas mixtures containing boron or silicon-containing precursor gases and mask de-clogging gases may also be used to generate the second plasma 330 shown in FIG. 3C. Other process conditions may also be used. In some embodiments, the process shown in FIG. 3B to form the boron or silicon-containing passivation layer 340 and de-clog the openings 318 may be performed at roughly the same temperature used to etch the openings 318 within the carbon-containing hard mask layer 306. Although not limited to such, performing the etch, passivation and de-clog steps at the same process temperature may reduce throughput by avoiding temperature changes within the plasma chamber.

After the substrate is exposed to the second plasma 330 in FIG. 3C, the substrate is re-exposed to the first plasma 320 to continue etching the exposed portions of the carbon-containing hard mask layer 306. In some embodiments, the first plasma 320 may continue etching the exposed portions of carbon-containing hard mask layer 306 until the exposed portions are completely removed, as shown in FIG. 3D. In other embodiments, the processing steps shown in FIGS. 3B and 3C may be repeated a number of cycles and/or until the exposed portions of the carbon-containing hard mask layer 306 are completely removed.

For example, after partially etching the exposed portions of carbon-containing hard mask layer 306 to the first depth (d1) in FIG. 3B and forming a boron or silicon-containing passivation layer 340 on the sidewall surfaces of the openings 318 in FIG. 3C, the HAR etch process 350 may continue etching the exposed portions of the carbon-containing hard mask layer 306 to a second depth (not shown), which is greater than the first depth (d1). If the second depth is less than the thickness (T) of the carbon-containing hard mask layer 306, the processing steps shown in FIGS. 3B and 3C may be repeated to form another boron or silicon-containing passivation layer 340 on the sidewall surfaces of the openings 318 and continue etching of the exposed portions of the carbon-containing hard mask layer 306. This process may be repeated for a number of cycles (e.g., 5 to 15) and/or until the exposed portions of the carbon-containing hard mask layer 306 are completely removed, as shown in FIG. 3D.

The HAR etch process 350 shown in FIGS. 3A-3D provides various advantages over conventional processes used to etch HAR features (such as openings 318) within a carbon-containing hard mask layer 306, such as an ACL hard mask layer. Compared to the conventional ACL etch process shown in FIGS. 2A-2F, the HAR etch process 350 shown in FIGS. 3A-3D significantly improves throughput by combining the sidewall passivation and mask de-clogging steps in a single plasma process (in FIG. 3C). In some embodiments, the HAR etch process 350 may improve throughput by more than at least 10 minutes/wafer, in other embodiments at least 20 minutes/wafer, and in other embodiments 26 minutes/wafer, compared to the conventional ACL etch process shown in FIGS. 2A-2F. In addition to combining sidewall passivation and mask de-clogging steps, the HAR etch process 350 improves throughput by: (a) using a non-ALD plasma process to form the boron or silicon-containing passivation layer 340 on the sidewall surfaces of the openings 318, (b) forming the passivation layer 340 and etching the carbon-containing hard mask layer 306 within the same plasma chamber, and/or (c) maintaining the same process temperature within the plasma chamber during the sidewall passivation/de-clog and carbon etch steps.

Some conventional ACL etch processes have used precursor gases containing metals (such as aluminum or tungsten) or metal halides (such as tungsten halides, molybdenum halides and titanium halides) to form metal-containing passivation layers on the sidewall of HAR features formed within an ACL hard mask layer. In one example process, a plasma generated from tungsten hexafluoride ($WF_6$) and hydrogen ($H_2$) precursor gases was used to form a tungsten-containing sidewall passivation layer. The H-rich and high source power conditions used to generate the plasma resulted in excessive W-precursor defluorination (difficult to control tungsten precursor dissociation), rendering the sidewall passivation process very sensitive to $WF_6$ gas flow rate and resulting in a very narrow process window (e.g., 1-2 sccm).

In contrast, the HAR etch process 350 shown in FIGS. 3A-3D utilizes a passivation precursor gas, which provides better process window than other precursor gases used to form passivation layers on HAR features. As noted above, the HAR etch process 350 performs sidewall passivation in FIG. 3C using a plasma generated from a boron or silicon-containing precursor gas. In certain embodiments, the boron or silicon-containing precursor gas may be a boron halide, a silicon halide, a borane or a silane. In one example embodiment, the boron or silicon-containing precursor gas is boron trichloride ($BCl_3$). During etch experiments performed on example test wafers, adding a $BCl_3$ precursor gas to a fluorocarbon-based mask de-clog chemistry resulted in a more controllable $BCl_3$ precursor dissociation and a much wider process window than the tungsten-based sidewall passivation process.

Etch experiments were performed on test wafers to investigate optimal plasma process conditions for the combined sidewall passivation and mask de-clog step shown in FIG. 3C. Prior to the etch experiments, deposition and lithography steps were performed to provide a stacked structure on a base substrate, as shown for example in FIG. 3A. In the test wafers, the carbon-containing hard mask layer 306 was an ACL hard mask layer having a thickness of approximately 2.5 μm. The overlying layers 308 formed over the ACL hard mask layer included an approximately 340 nm silicon oxynitride (SiON) hard mask layer, 400 nm ODL and 30 nm SiARC layer, providing a combined thickness of approximately 770 nm. After exposing the test wafers to a first plasma 320 (e.g., an oxygen and sulfur-based plasma) to etch openings in the ACL hard mask layer, as shown in FIG. 3B, the test wafers were exposed to a second plasma 330 generated by supplying various mixtures of boron trichloride ($BCl_3$), hexafluorobutadiene ($C_4F_6$), oxygen ($O_2$) and argon (Ar) to the plasma chamber in the presence of 50 W source power, 600 W bias power and 20 mTorr chamber pressure. During the etch experiments, the second plasma 330 was generated by adding variable gas flow rates (e.g., 6, 60 and 177 sccm) of $BCl_3$ to a gas mixture including 25 sccm of $C_4F_6$, 30 sccm of $O_2$, 270 sccm of Ar.

Figures 4A, 4B, 4C:
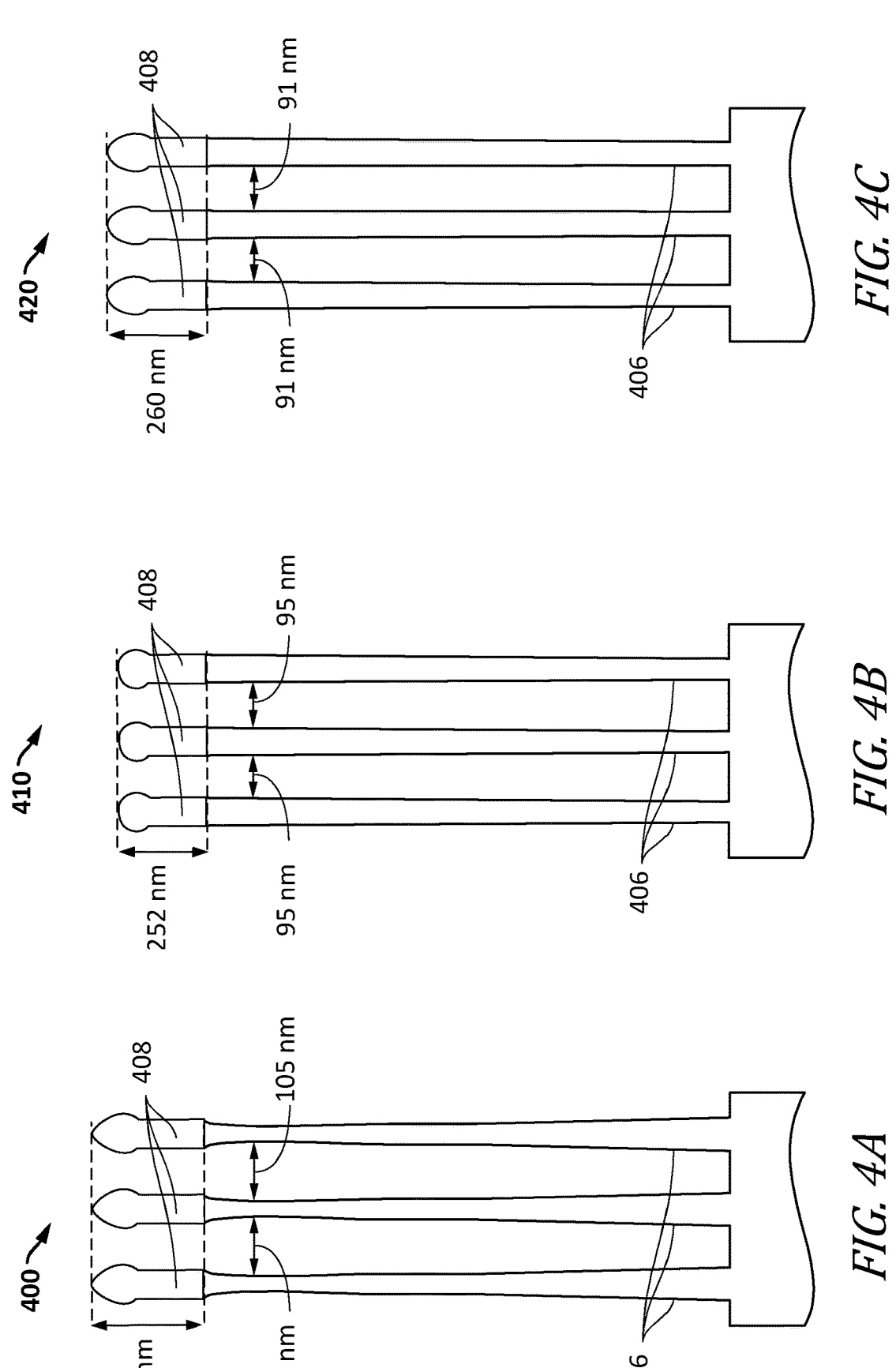
FIGS. 4A-4C are cross-sectional views through test wafers having an ACL hard mask layer, illustrating results obtained from various etch experiments conducted to etch openings within the ACL hard mask layer in accordance with the techniques described herein.

FIGS. 4A-4C are cross-sectional views through various test wafers 400, 410 and 420 illustrating the results obtained from the etch experiments. Each of the test wafers 400, 410 and 420 included one or more overlying layers 408 formed above an ACL hard mask layer 406. The ACL hard mask layer 406 and the overlying layer(s) 408 were configured as described above. FIGS. 4A-4C illustrate the openings created within ACL hard mask layer 406 after exposing the test wafers to the first plasma 320 and second plasma 330 described above a number of times (e.g., 1 or more times), resulting in an ACL etch depth of approximately 1.85-1.91 μm.

To achieve the results shown in FIG. 4A, the second plasma 330 was generated by supplying a gas mixture of 25 sccm of $C_4F_6$, 30 sccm of $O_2$, 270 sccm of Ar and 6 sccm of $BCl_3$ to the plasma chamber under the process conditions listed above. This passivation and de-clog gas chemistry decreased the thickness of the overlying layers 408 to about 272 nm and resulted in a relatively large bow CD of approximately 105 nm near the top of the ACL hard mask layer 406. These results indicate that a relatively low flow rate of $BCl_3$ (e.g., 6 sccm, or approximately 10% of the combined process gas flow) is too low to provide sufficient sidewall passivation, possibly due to the second plasma 330 having significantly less boron dichloride ($BCl_2$) radicals than difluoromethylene ($CF_2$) radicals.

The $BCl_3$ gas flow rate was increased to 177 sccm to achieve the results shown in FIG. 4B. When 177 sccm of $BCl_3$ gas was added to the mask de-clog chemistry, the thickness of the overlying layers 408 was reduced to about 252 nm and the bow CD near the top of the ACL hard mask layer 406 was approximately 95 nm. These results indicate that a relatively high flow rate of $BCl_3$ (e.g., 177 sccm, or approximately 76% of the combined process gas flow) may erode the SiON hard mask layer overlying the ACL hard mask layer 406, possibly due to the second plasma 330 having more chlorine (Cl) or $BCl_2$ radicals than $CF_2$ radicals.

A 60 sccm $BCl_3$ gas flow was added to mask de-clog chemistry to achieve the results shown in FIG. 4C. Out of the three etch experiments performed, adding 60 sccm of $BCl_3$ gas to the mask de-clog chemistry provided the smallest bow CD (e.g., 91 nm) and reduced the thickness of the overlying layers 408 to about 260 nm. These results show that a moderate flow rate of $BCl_3$ (e.g., 60 sccm, or approximately 50% of the combined process gas flow) may provide sufficient sidewall passivation on the openings formed within the ACL hard mask layer 406, while preventing erosion of SiON hard mask layer overlying the ACL hard mask layer 406. When the $BCl_3$ gas flow rate is approximately 50% of the combined gas flow of the processes gases (e.g., $BCl_3$, $C_4F_6$ and $O_2$) used to generate the second plasma 330, the second plasma 330 may include a substantially equal amount of $BCl_2$ radicals and $CF_2$ radicals, which may contribute to the optimal results.

Figure 6:
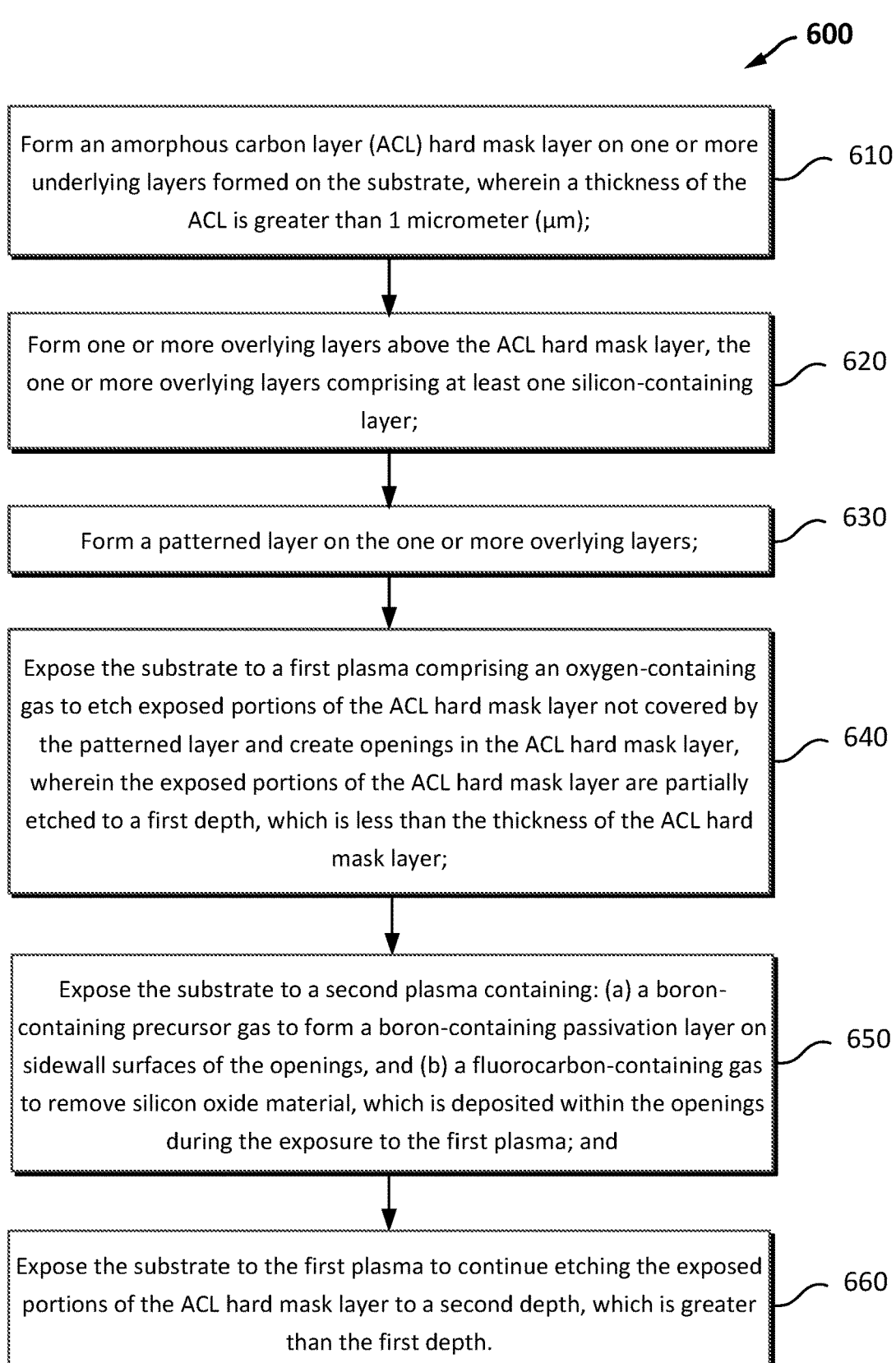
FIG. 6 is a flowchart diagram illustrating another embodiment of a method to pattern a substrate in accordance with the techniques described herein.

FIGS. 5-6 illustrate exemplary methods for use of the processing techniques described herein. It will be recognized that the embodiments of FIGS. 5-6 are merely exemplary and additional methods may utilize the techniques described herein. Further, additional processing steps may be added to the methods shown in the FIGS. 5-6 as the steps described are not intended to be exclusive. Moreover, the order of the steps is not limited to the order shown in the figures as different orders may occur and/or various steps may be performed in combination or at the same time.

FIG. 5 illustrates one embodiment of a method 500 that uses the techniques disclosed herein to pattern a substrate. As shown in FIG. 5, the method 500 begins by forming a carbon-containing hard mask layer on one or more underlying layers formed on the substrate (in step 510), forming one or more overlying layers above the carbon-containing hard mask layer, the one or more overlying layers comprising at least one silicon-containing layer (in step 520) and forming a patterned layer on the one or more overlying layers (in step 530). In some embodiments of the method 500, the thickness of the carbon-containing hard mask layer may be greater than 1 micrometer (μm). For example, the thickness of the carbon-containing hard mask layer may range between 1 μm and 4 μm. After forming the various layers as described in steps 510, 520 and 530, the method 500 may expose the substrate to a series of plasma steps to etch openings within exposed portions of the carbon-containing hard mask layer.

For example, the method 500 may expose the substrate to a first plasma (in step 540) to etch exposed portions of the carbon-containing hard mask layer not covered by the patterned layer and create openings in the carbon-containing hard mask layer. When exposed to the first plasma in step 540, the exposed portions of the carbon-containing hard mask layer are partially etched to a first depth, which is less than the thickness of the carbon-containing hard mask layer. After creating the openings in the carbon-containing hard mask layer (in step 540), the substrate is exposed to a second plasma (in step 550) to form a passivation layer on sidewall surfaces of the openings and remove any etch by-products, which may adhere to and clog the openings created in the carbon-containing hard mask layer.

In the method 500, the substrate is exposed to a second plasma containing: (a) a boron or silicon-containing precursor gas to form a boron or silicon-containing passivation layer on sidewall surfaces of the openings, and (b) a mask de-clogging gas to remove any etch by-products, which are deposited within the openings during the exposure to the first plasma. After forming the boron or silicon-containing passivation layer (in step 550), the method 500 re-exposes the substrate to the first plasma (in step 560) to continue etching the exposed portions of the carbon-containing hard mask layer to a second depth, which is greater than the first depth. In some embodiments, method 500 may repeat steps 550 and 560 for a number of cycles and/or until the exposed portions of the carbon-containing hard mask layer are completely removed.

FIG. 6 illustrates another embodiment of a method 600 that uses the techniques disclosed herein to pattern a substrate. As shown in FIG. 6, the method 600 begins by forming an amorphous carbon layer (ACL) hard mask layer on one or more underlying layers formed on the substrate (in step 610), forming one or more overlying layers above the ACL hard mask layer, the one or more overlying layers comprising at least one silicon-containing layer (in step 620) and forming a patterned layer on the one or more overlying layers (in step 630). In some embodiments of the method 600, the thickness of the ACL hard mask layer may be greater than 1 micrometer (μm). For example, the thickness of the ACL hard mask layer may range between 1 μm and 4 μm. After forming the various layers as described in steps 610, 620 and 630, the method 600 may expose the substrate to a series of plasma steps to etch openings within exposed portions of the ACL hard mask layer.

For example, the method 600 may expose the substrate to a first plasma comprising an oxygen-containing gas (in step 640) to etch exposed portions of the ACL hard mask layer not covered by the patterned layer and create openings in the ACL hard mask layer. When exposed to the first plasma in step 640, the exposed portions of the ACL hard mask layer are partially etched to a first depth, which is less than the thickness of the ACL hard mask layer. After creating the openings in the ACL hard mask layer (in step 640), the substrate is exposed to a second plasma (in step 650) to form a passivation layer on sidewall surfaces of the openings and remove any material, which may adhere to and clog the openings created in the ACL hard mask layer.

In the method 600, the substrate is exposed to a second plasma containing: (a) a boron-containing precursor gas to form a boron-containing passivation layer on sidewall surfaces of the openings, and (b) a fluorocarbon-containing gas to remove silicon oxide material, which is deposited within the openings during the exposure to the first plasma. After forming the boron-containing passivation layer (in step 650), the method 500 re-exposes the substrate to the first plasma (in step 660) to continue etching the exposed portions of the ACL hard mask layer to a second depth, which is greater than the first depth. In some embodiments, method 600 may repeat steps 650 and 660 for a number of cycles and/or until the exposed portions of the ACL hard mask layer are completely removed.

The methods shown in FIGS. 5 and 6 may use a wide variety of process gases to generate the second plasma used to form the sidewall passivation layer and remove etch by-products to de-clog the openings in steps 550 and 650.

In some embodiments, the methods shown in FIGS. 5 and 6 may use a boron-containing precursor gas or a silicon-containing precursor gas, such as a boron halide, a silicon halide, a borane or a silane, to form the sidewall passivation layer. Examples of boron halides and silicon halides that may be used to form the sidewall passivation layer include, but are not limited to, boron trichloride ($BCl_3$), boron trifluoride ($BF_3$), boron tribromide ($BBr_3$), tetrachlorosilane ($SiCl_4$) and tetrafluorosilane ($SiF_4$). Examples of boranes and silanes include borane ($BH_3$), silane ($SiH_4$), chlorosilane ($SiClH_3$), dichlorosilane ($SiCl_2H_2$), trichlorosilane ($SiCl_3H$), disilane ($Si_2H_6$), monochlorodisilane ($Si_2ClH_5$), dichlorodisilane ($Si_2Cl_2H_4$), trichlorodisilane ($Si_2Cl_3H_3$), tetrachlorodisilane ($Si_2Cl_4H_2$), pentachlorodisilane ($Si_2Cl_5H$) or hexachlorodisilane ($Si_2Cl_6$). Other boron or silicon-containing precursor gases may also be utilized.

In some embodiments, the methods shown in FIGS. 5 and 6 may use a fluorocarbon or hydrofluorocarbon gas to selectively remove etch by-products from the openings. Examples of fluorocarbon and hydrofluorocarbon gases include, but are not limited to, hexafluorobutadiene ($C_4F_6$), perfluorocyclobutane ($C_4F_8$), hexafluoroethane ($C_2F_6$), tetrafluoromethane ($CF_4$), hexafluoropropylene ($C_3F_6$), trifluoromethane ($CHF_3$), difluoromethane ($CH_2F_2$) or monofluoromethane ($CH_3F$). In some embodiments, oxygen ($O_2$) and/or an inert gas (e.g., $N_2$, Ar, He, Ne, Kr, Xe, etc.) may be added to the fluorocarbon or hydrofluorocarbon gas chemistry.

In some embodiments of the methods shown in FIGS. 5 and 6, the second plasma is generated by combining a boron halide with a fluorocarbon, such that the second plasma comprises a substantially equal amount of boron halide radicals and fluorocarbon radicals. For example, the second plasma may be generated by combining boron trichloride ($BCl_3$) and hexafluorobutadiene ($C_4F_6$), such that the second plasma includes a substantially equal amount of boron dichloride ($BCl_2$) radicals and difluoromethylene ($CF_2$) radicals.

In some embodiments of the methods shown in FIGS. 5 and 6, the flow rate of the boron or silicon-containing precursor gas may range between 20% to 70%, between 30% to 60%, or between 45% to 55% of a combined gas flow of the process gases used to generate the second plasma. By restricting the flow rate of the boron or silicon-containing precursor gas to an appropriate range, the radicals generated within the second plasma may provide sufficient sidewall passivation on the openings formed within the carbon-containing hard mask layer, while preventing erosion of silicon-containing layer(s) overlying the carbon-containing hard mask layer. In one example embodiment, the second plasma may be generated by combining boron trichloride ($BCl_3$), hexafluorobutadiene ($C_4F_6$) and oxygen ($O_2$), and the $BCl_3$ gas flow may be approximately 50% of the combined gas flow of $BCl_3$, $C_4F_6$ and $O_2$.

Figure 7:
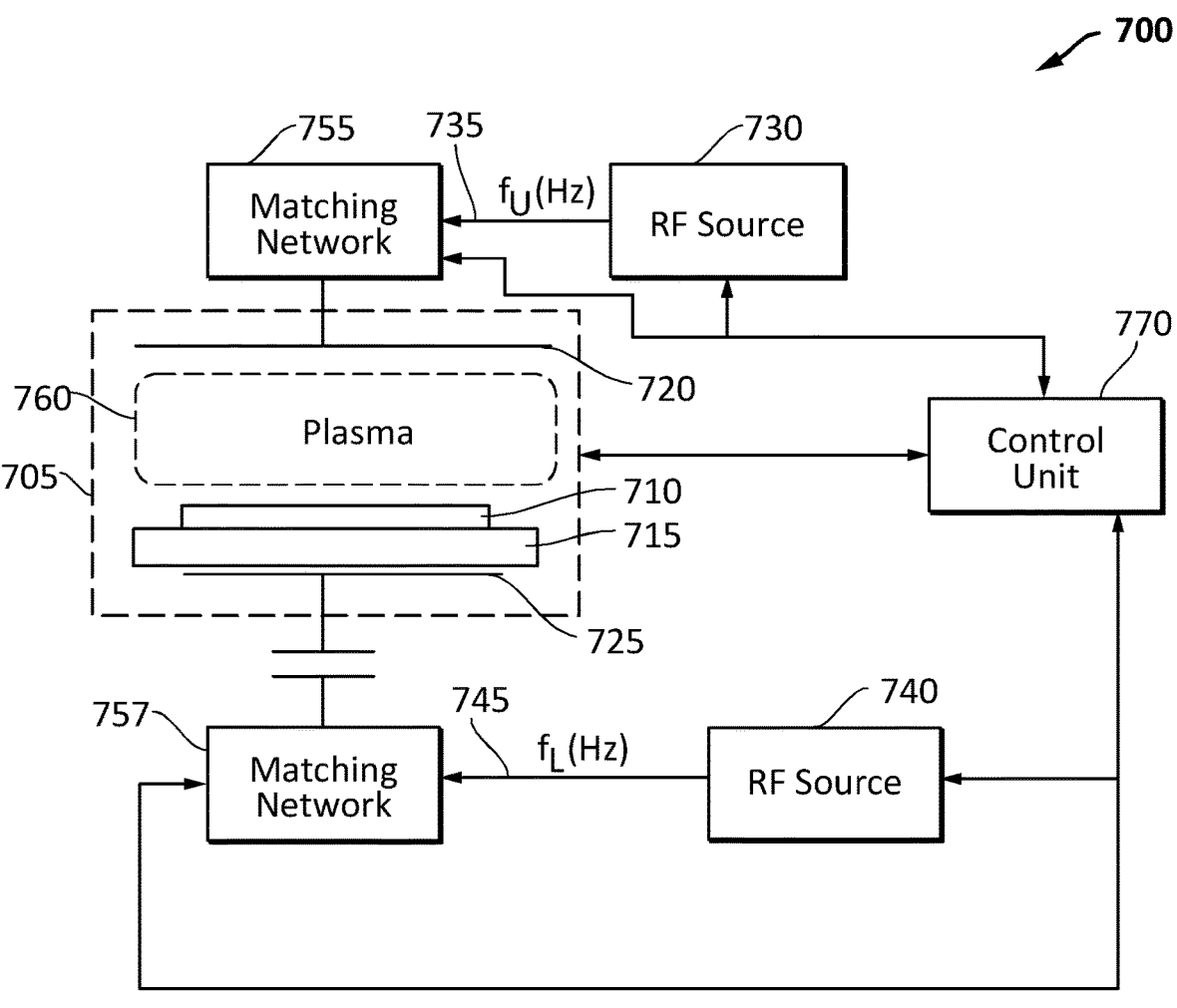
FIG. 7 is a block diagram illustrating one embodiment of a plasma processing system that may be used to pattern a substrate using the techniques described herein.

FIG. 7 provides one example embodiment for a plasma processing system 700 in which the techniques disclosed herein could be used. The plasma processing system 700 shown in FIG. 7 is a capacitively coupled plasma (CCP) processing system. However, one skilled in the art would recognize the techniques disclosed herein could also be performed in an inductively coupled plasma (ICP) processing system, microwave plasma processing system, Radial Line Slot Antenna (RLSA™) microwave plasma processing system, electron cyclotron resonance (ECR) plasma processing system, or other type of processing system or combination of systems. Thus, it will be recognized by those skilled in the art that the techniques disclosed herein may be utilized with any of a wide variety of plasma processing systems.

The plasma processing system 700 can be used for a wide variety of operations including, but not limited to, etching, deposition, cleaning, plasma polymerization, plasma-enhanced chemical vapor deposition (PECVD), and so forth. The structure of a plasma processing system 700 is well known, and the particular structure is provided merely for illustrative purposes. It will be recognized that different and/or additional plasma process systems may be implemented while still taking advantage of the techniques described herein.

As shown in FIG. 7, the plasma processing system 700 may include a process chamber 705, which in one embodiment, may be a pressure controlled chamber. A substrate 710 (e.g., a semiconductor wafer) may be held on a stage or chuck 715. An upper electrode 720 and a lower electrode 725 is provided above and below the chuck 715, as shown. The upper electrode 720 is electrically coupled to a first radio frequency (RF) source 730 through a first matching network 755. The first RF source 730 may provide a source voltage 735 at an upper frequency (fu) to the first matching network 755. The lower electrode 725 is electrically coupled to a second RF source 740 through a second matching network 757. The second RF source 740 may provide a bias voltage 745 at a lower frequency (ft) to the second matching network 757. Though not shown, it will be known by those skilled in the art that a voltage may also be applied to the chuck 715.

Components of the plasma processing system 700 can be connected to, and controlled by, a control unit 770 that in turn can be connected to a corresponding memory storage unit and user interface (all not shown). Various plasma processing operations can be executed via the user interface, and various plasma processing recipes and operations can be stored in a storage unit. Accordingly, a given substrate can be processed within the process chamber 705 with various microfabrication techniques. It will be recognized that control unit 770 may be coupled to various components of the plasma processing system 700 to receive inputs from, and provide outputs to, the components.

The control unit 770 can be implemented in a wide variety of manners. For example, the control unit 770 may be a computer. In another example, the control unit 770 may include one or more programmable integrated circuits that are programmed to provide the functionality described herein. For example, one or more processors (e.g., a microprocessor, microcontroller, central processing unit, etc.), programmable logic devices (e.g., a complex programmable logic device (CPLD), field programmable gate array (FPGA), etc.), and/or other programmable integrated circuits can be programmed with software or other programming instructions to implement the functionality of a proscribed process recipe. It is further noted that the software or other programming instructions can be stored in one or more non-transitory computer-readable mediums (e.g., memory storage devices, FLASH memory, dynamic random access memory (DRAM), reprogrammable storage devices, hard drives, floppy disks, DVDs, CD-ROMs, etc.), and the software or other programming instructions when executed by the programmable integrated circuits may cause the programmable integrated circuits to perform the processes, functions, and/or capabilities described herein. Other variations could also be implemented.

During some processing steps, the plasma processing system 700 may apply power from the first RF source 730 and the second RF source 740 to the upper and lower electrodes to generate a plasma 760 in the process chamber 705. When a plasma 760 is generated within the process chamber 705, ions within the plasma 760 are attracted to the substrate 710. The generated plasma 760 can be used for processing a target substrate (such as substrate 710 or any material to be processed) in various types of treatments such as, but not limited to, plasma etching, deposition and/or sputtering. For example, plasma 760 may be generated within the process chamber 705 to perform one or more of the process steps shown in FIGS. 3B, 3C and 3D.

In the CCP processing system shown in FIG. 7, application of power results in a high-frequency electric field being generated between the upper electrode 720 and the lower electrode 725. Process gases delivered to the process chamber 705 can then be dissociated and converted into the plasma 760. As shown in FIG. 7, the exemplary plasma processing system 700 described herein utilizes two RF sources. In an exemplary embodiment, the first RF source 730 provides source power at relatively high frequencies to convert the processing gas(es) delivered into the process chamber 705 into the plasma 760 and to control the plasma density. The second RF source 740 provides a bias power at lower frequencies to control ion bombardment energy.

In one example plasma processing system, for example, the first RF source 730 may provide about 0 to 1400 W of source power in a high-frequency (HF) range from about 3 MHz to 150 MHz (or above) to the upper electrode 720, and the second RF source 740 may provide about 0 to 1400 W of bias power in a low-frequency (LF) range from about 0.2 MHz to 60 MHz to the lower electrode 725. Different operational ranges can also be used depending on type of plasma processing system and the type of treatments (e.g., etching, deposition, sputtering, etc.) performed therein.

In one exemplary embodiment, the first plasma 320 step shown in FIGS. 3B and 3D may be performed with process conditions of 500 W to 5000 W source power, 200 W to 10,000 W bias power, 10 mT to 100 mT pressure, 0° C. to 40° C. electrostatic chuck temperature, and a gas flow mixture of oxygen ($O_2$) and sulfur-containing gases (e.g., $SO_2$), where the $O_2$% ranges between 50-100%, optionally with the addition of one or more inert gases (e.g., Ar, Kr, etc.).

In one exemplary embodiment, the second plasma 330 step shown in FIG. 3C may be performed with process conditions of 25 W to 100 W source power, 100 W to 600 W bias power, 10 mT to 30 mT pressure, 0° C. to 40° C. electrostatic chuck temperature, and a gas flow mixture of 25 sccm of $C_4F_6$, 30 sccm of $O_2$, 270 sccm of Ar and 60 sccm of $BCl_3$.

It is noted that the techniques described herein may be utilized within a wide range of plasma processing systems. Although a particular plasma processing system 700 is shown in FIG. 7, it will be recognized that the techniques described herein may be utilized within other plasma processing systems. In one example system, the RF sources shown in FIG. 7 may be switched (e.g., higher frequencies may be supplied to the lower electrode 725 and lower frequencies may be supplied to the upper electrode 720). Further, a dual source system is shown in FIG. 7 merely as an example system. It will be recognized that the techniques described herein may be utilized with other plasma processing systems in which a modulated RF power source is provided to one or more electrodes, direct current (DC) bias sources are utilized, or other system components are utilized. It is further recognized that other plasma processing systems, such as an ICP processing system may also be used to perform one or more of the various deposition and etch processes described herein.

It is noted that various deposition processes can be used to form one or more of the material layers shown in FIGS. 3A-3D and described herein. For example, chemical vapor deposition (e.g., CVD, PECVD), physical vapor deposition (PVD), plasma deposition (e.g., CCP, ICP), spin-on processes, atomic layer deposition (ALD), and/or other deposition processes can be used to form the underlying layer(s) 304, the carbon-containing hard mask layer 306, the overlying layer(s) 308 and the patterned layer 310 on the substrate to form the stacked structure 300 shown in FIG. 3A.

It is further noted that various etch processes can be used to etch one or more of the material layers shown and described herein. For example, one or more etch processes can be implemented using plasma etch processes, discharge etch processes, and/or other desired etch processes. In a first example plasma etch process, a gas mixture including but not limited to $SO_2$ and $O_2$ optionally in combination with one or more dilution gases (e.g., argon, nitrogen, etc.) can be used at a variety of pressure, power, flow and temperature conditions to etch the exposed portions of the carbon-containing hard mask layer 306. In a second example plasma etch process, a gas mixture including but not limited to $C_4F_6$ and $O_2$ optionally in combination with one or more dilution gases (e.g., argon, nitrogen, etc.) can be used at a variety of pressure, power, flow and temperature conditions to remove etch by-products generated during the first example plasma etch process.

Other operating variables for process steps can also be adjusted to control the various deposition and/or etch processes described herein. The operating variables may include, for example, the chamber temperature, chamber pressure, flowrates of gases, types of gases, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, the term "substrate" is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for patterning a substrate, the method comprising:

forming a carbon-containing hard mask layer on one or more underlying layers formed on the substrate, wherein a thickness of the carbon-containing hard mask layer is greater than 1 micrometer ($\mu$m);

forming one or more overlying layers above the carbon-containing hard mask layer, the one or more overlying layers comprising at least one silicon-containing layer;

forming a patterned layer on the one or more overlying layers;

exposing the substrate to a first plasma to etch exposed portions of the carbon-containing hard mask layer not covered by the patterned layer and create openings in the carbon-containing hard mask layer, wherein the exposed portions of the carbon-containing hard mask layer are partially etched to a first depth, which is less than the thickness of the carbon-containing hard mask layer;

exposing the substrate to a second plasma containing: (a) a boron or silicon-containing precursor gas to form a boron or silicon-containing passivation layer on sidewall surfaces of the openings, and (b) a mask de-clogging gas to remove etch by-products, which are deposited within the openings during the exposure to the first plasma; and exposing the substrate to the first plasma to continue etching the exposed portions of the carbon-containing hard mask layer to a second depth, which is greater than the first depth.

2. The method of claim 1, further comprising repeating said exposing the substrate to the second plasma and said exposing the substrate to the first plasma to continue etching the exposed portions of the carbon-containing hard mask layer for a number of cycles or until the exposed portions of the carbon-containing hard mask layer are completely removed.

3. The method of claim 1, wherein the carbon-containing hard mask layer is an amorphous carbon layer (ACL).

4. The method of claim 1, wherein the first plasma is an oxygen-based plasma, and wherein during said exposing the substrate to the first plasma, the oxygen-based plasma:

etches the exposed portions of the carbon-containing hard mask layer not covered by the patterned layer to create the openings in the carbon-containing hard mask layer; and etches exposed portions of the at least one silicon-containing layer, which creates silicon oxide etch by-products that are deposited within the openings.

5. The method of claim 4, wherein the mask de-clogging gas comprises a fluorocarbon or a hydrofluorocarbon, and wherein during said exposing the substrate to the second plasma, fluorocarbon radicals within the second plasma selectively etch the silicon oxide etch by-products to remove the silicon oxide etch by-products deposited within the openings.

6. The method of claim 5, wherein the mask de-clogging gas comprises hexafluorobutadiene ($C_4F_6$), perfluorocyclobutane ($C_4F_8$), hexafluoroethane ($C_2F_6$), tetrafluoromethane ($CF_4$), hexafluoropropylene ($C_3F_6$), trifluoromethane ($CHF_3$), difluoromethane ($CH_2F_2$) or monofluoromethane ($CH_3F$).

7. The method of claim 1, wherein the boron or silicon-containing precursor gas comprises a boron halide or a silicon halide.

8. The method of claim 7, wherein the boron or silicon-containing precursor gas comprises boron trichloride ($BCl_3$), boron trifluoride ($BF_3$), boron tribromide ($BBr_3$), tetrachlorosilane ($SiCl_4$) or tetrafluorosilane ($SiF_4$).

9. The method of claim 1, wherein the boron or silicon-containing precursor gas comprises a borane or a silane.

10. The method of claim 9, wherein the boron or silicon-containing precursor gas comprises borane ($BH_3$), silane ($SiH_4$), chlorosilane ($SiClH_3$), dichlorosilane ($SiCl_2H_2$), trichlorosilane ($SiCl_3H$), disilane ($Si_2H_6$), monochlorodisilane ($Si_2ClH_5$), dichlorodisilane ($Si_2Cl_2H_4$), trichlorodisilane ($Si_2Cl_3H_3$), tetrachlorodisilane ($Si_2Cl_4H_2$), pentachlorodisilane ($Si_2Cl_5H$) or hexachlorodisilane ($Si_2Cl_6$).

11. The method of claim 1, wherein the boron or silicon-containing precursor gas comprises a boron halide, wherein the mask de-clogging gas comprises a fluorocarbon, and wherein the second plasma comprises a substantially equal amount of boron halide radicals and fluorocarbon radicals.

12. The method of claim 11, wherein the boron or silicon-containing precursor gas comprises boron trichloride ($BCl_3$), wherein the mask de-clogging gas comprises hexafluorobutadiene ($C_4F_6$), and wherein the second plasma comprises a substantially equal amount of boron dichloride ($BCl_2$) radicals and difluoromethylene ($CF_2$) radicals.

13. The method of claim 1, wherein the boron or silicon-containing precursor gas comprises boron trichloride ($BCl_3$), wherein the mask de-clogging gas comprises hexafluorobutadiene ($C_4F_6$), wherein the second plasma further contains oxygen ($O_2$), and wherein a gas flow rate of the boron trichloride ($BCl_3$) is between 20% to 70% of a combined gas flow of the boron trichloride ($BCl_3$), the hexafluorobutadiene ($C_4F_6$) and the oxygen ($O_2$).

14. A method for patterning a substrate, the method comprising:

forming an amorphous carbon layer (ACL) hard mask layer on one or more underlying layers formed on the substrate, wherein a thickness of the ACL hard mask layer is greater than 1 micrometer (μm); and forming one or more overlying layers above the ACL hard mask layer, the one or more overlying layers comprising at least one silicon-containing layer;

forming a patterned layer on the one or more overlying layers;

exposing the substrate to a first plasma comprising an oxygen-containing gas to etch exposed portions of the ACL hard mask layer not covered by the patterned layer and create openings in the ACL hard mask layer, wherein the exposed portions of the ACL hard mask layer are partially etched to a first depth, which is less than the thickness of the ACL hard mask layer;

exposing the substrate to a second plasma containing: (a) a boron-containing precursor gas to form a boron-containing passivation layer on sidewall surfaces of the openings, and (b) a fluorocarbon-containing gas to remove silicon oxide material, which is deposited within the openings during the exposure to the first plasma; and exposing the substrate to the first plasma to continue etching the exposed portions of the ACL hard mask layer to a second depth, which is greater than the first depth.

15. The method of claim 14, further comprising repeating said exposing the substrate to the second plasma and said exposing the substrate to the first plasma to continue etching the exposed portions of the ACL hard mask layer for a number of cycles or until the exposed portions of the ACL hard mask layer are completely removed.

16. The method of claim 14, wherein during said exposing the substrate to the second plasma, fluorocarbon radicals within the second plasma selectively etch the silicon oxide material to remove the silicon oxide material deposited within the openings.

17. The method of claim 14, wherein the boron-containing precursor gas comprises boron trichloride ($BCl_3$), boron trifluoride ($BF_3$), boron tribromide ($BBr_3$) or borane ($BH_3$), and wherein the fluorocarbon-containing gas comprises hexafluorobutadiene ($C_4F_6$), perfluorocyclobutane ($C_4F_8$), hexafluoroethane ($C_2F_6$), tetrafluoromethane ($CF_4$), hexafluoropropylene ($C_3F_6$), trifluoromethane ($CHF_3$), difluoromethane ($CH_2F_2$) or monofluoromethane ($CH_3F$).

18. The method of claim 17, wherein the second plasma comprises a substantially equal amount of boron halide radicals and fluorocarbon radicals.

19. The method of claim 17, wherein the boron-containing precursor gas comprises boron trichloride ($BCl_3$), wherein the fluorocarbon-containing gas comprises hexafluorobutadiene ($C_4F_6$), and wherein the second plasma comprises a substantially equal amount of boron dichloride ($BCl_2$) radicals and difluoromethylene ($CF_2$) radicals.

20. The method of claim 14, wherein the boron-containing precursor gas comprises boron trichloride ($BCl_3$), wherein the fluorocarbon-containing gas comprises hexafluorobutadiene ($C_4F_6$), wherein the second plasma further comprises an oxygen-containing gas, and wherein a gas flow rate of the boron trichloride ($BCl_3$) is between 20% and 70% of a combined gas flow of the boron trichloride ($BCl_3$), the hexafluorobutadiene ($C_4F_6$) and the oxygen-containing gas.

* * * * *